(12) United States Patent
Szczeszynski et al.

(10) Patent No.: US 12,525,508 B2
(45) Date of Patent: Jan. 13, 2026

(54) METHODS, APPARATUSES, INTEGRATED CIRCUITS, AND CIRCUIT BOARDS FOR POWER CONVERSION WITH REDUCED PARASITICS

(71) Applicant: Murata Manufacturing Co., Ltd., Kyoto (JP)

(72) Inventors: Gregory Szczeszynski, Nashua, NH (US); Jeffrey Chad Bryan, Rindge, NH (US)

(73) Assignee: Murata Manufacturing Co., Ltd., Kyoto (JP)

( * ) Notice: Subject to any disclaimer, the term of this patent is extended or adjusted under 35 U.S.C. 154(b) by 486 days.

(21) Appl. No.: 18/053,973

(22) Filed: Nov. 9, 2022

(65) Prior Publication Data

US 2024/0153847 A1    May 9, 2024

(51) Int. Cl.
*H01L 23/48* (2006.01)
*H01L 23/522* (2006.01)
*H01L 23/528* (2006.01)

(52) U.S. Cl.
CPC .......... *H01L 23/48* (2013.01); *H01L 23/5226* (2013.01); *H01L 23/5283* (2013.01)

(58) Field of Classification Search
CPC . H01L 23/48; H01L 23/5226; H01L 23/5283; H01L 2224/04105; H01L 2224/16227; H01L 2224/2518; H01L 25/16; H01L 23/482; H01L 24/20; H02M 3/07; H02M 3/003; H02M 3/156
See application file for complete search history.

(56) References Cited

U.S. PATENT DOCUMENTS

| | | | |
|---|---|---|---|
| 8,148,823 B1 | 4/2012 | Vinciarelli et al. | |
| 2002/0105009 A1 | 8/2002 | Eden et al. | |
| 2009/0160595 A1 | 6/2009 | Feng et al. | |
| 2017/0263651 A1* | 9/2017 | Tochibayashi | ....... H10D 86/423 |
| 2018/0053755 A1* | 2/2018 | Cho | .................. H01L 23/49811 |
| 2018/0054119 A1 | 2/2018 | Cho et al. | |
| 2021/0242863 A1 | 8/2021 | Clavette et al. | |
| 2023/0095471 A1* | 3/2023 | Shaikh | ................ H02M 3/1584 323/271 |

OTHER PUBLICATIONS

International Search Report and Written Opinion mailed May 10, 2024, in counterpart PCT International Application No. PCT/US2023/078210, 25 pages.

* cited by examiner

*Primary Examiner* — Karen Kusumakar
(74) *Attorney, Agent, or Firm* — Haynes and Boone, LLP

(57) ABSTRACT

Disclosed embodiments include methods, apparatuses, integrated circuits, and circuit boards for power conversion with reduced parasitics. The apparatuses include an integrated circuit for power conversion. The integrated circuit includes a plurality of power transistors and a plurality of metal regions coupled to the power transistors. A first portion of the metal regions are coupled to source regions of the power transistors. A second portion of the metal regions are coupled to drain regions of the power transistors. The first and second portions have at least one of substantially equal numbers of metal regions, substantially equal resistances, or balanced distributions of metal regions.

31 Claims, 32 Drawing Sheets

FIG. 12

METHODS, APPARATUSES, INTEGRATED CIRCUITS, AND CIRCUIT BOARDS FOR POWER CONVERSION WITH REDUCED PARASITICS

TECHNICAL FIELD

The present disclosure relates to power conversion, and more particularly, to methods, apparatuses, integrated circuits, and printed circuit boards for power conversion with reduced parasitic losses.

BACKGROUND

Many electronic products, particularly mobile computing and/or communication products and components (e.g., notebook computers, ultra-book computers, tablet devices, LCD and LED displays), require multiple voltage levels. For example, power amplifiers for radio frequency transmitters may require relatively high voltages (e.g., 12 volts (V) or more), and logic circuitry may require a low voltage level (e.g., 1-2 V). Some other circuitry may require an intermediate voltage level (e.g., 5-10 V). Power converters are often used to generate a lower or higher voltage from a common power source, such as a battery, in order to meet the power requirements of different components in electronic products.

SUMMARY

Embodiments of the present disclosure may provide methods, apparatuses, integrated circuits, and circuit boards for power conversion with reduced parasitics.

These embodiments include an apparatus for power conversion. The apparatus includes an integrated circuit for power conversion. The integrated circuit includes a plurality of power transistors and a plurality of metal regions coupled to the power transistors. A first portion of the metal regions are coupled to source regions of the power transistors. A second portion of the metal regions are coupled to drain regions of the power transistors. The first and second portions have at least one of substantially equal numbers of metal regions, substantially equal resistances, or balanced distributions of metal regions.

These embodiments also include a power transistor for power conversion. The power transistor includes a plurality of active regions, a plurality of terminals, and a plurality of conductive paths. Each terminal is electrically coupled to at least one of the active regions via at least one of the conductive paths. Each conductive path comprises one or more laterally oriented metal conductors and one or more vertically oriented metal conductors. In a majority of the conductive paths, a sum of lengths of the one or more vertically oriented metal conductors exceeds a sum of lengths of the one or more laterally oriented metal conductors.

It is to be understood that the foregoing general description and the following detailed description are exemplary and explanatory only, and are not restrictive of the invention, as claimed.

BRIEF DESCRIPTION OF THE DRAWINGS

FIG. 12 illustrates exemplary configuration modes of the exemplary apparatus for power conversion in FIG. 1, in accordance with embodiments of the present disclosure.

DETAILED DESCRIPTION

Figure 1:
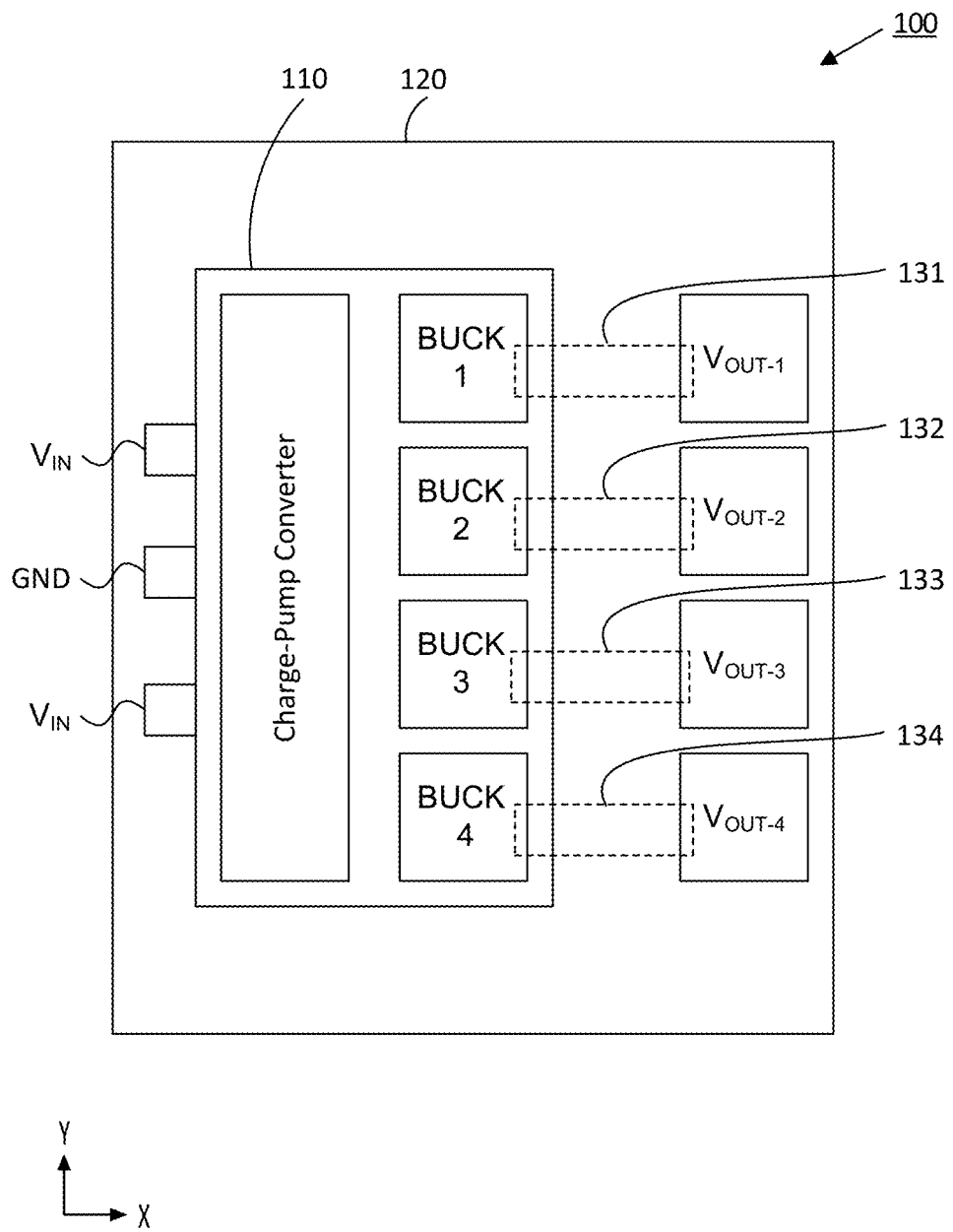
FIG. 1 is a diagram of exemplary apparatus for power conversion, in accordance with embodiments of the present disclosure.

The following disclosure provides many different exemplary embodiments, or examples, for implementing different features of the provided subject matter. Specific simplified examples of components and arrangements are described below to explain the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, the term "coupled" may also be termed as "electrically coupled", and the term "connected" may be termed as "electrically connected". "Coupled" and "connected" may also be used to indicate that two or more elements cooperate or interact with each other.

Power converters can receive, deliver or operate with high current in one or more of the current paths. The power delivery path and operation at high current can be susceptible to parasitic losses that negatively impact performance. Parasitic losses may be described as the product of $I^2$ and R, where "1" is current and "R" is resistance. As the current increases, the power loss becomes more pronounced. For example, the power delivery path and the high current of certain buck converters can reduce their power conversion efficiency due to the parasitic losses. Additional constraints may further exacerbate unwanted parasitic losses. For example, die space may be limited, prompting signals to be fanned out on a printed circuit board (PCB) and be routed as needed.

Disclosed embodiments may include designs that reduce the inductor requirements for buck converters. For example, embodiments may place a charge-pump converter between the input power and the buck converter. Because this arrangement reduces the inductor requirements for the buck converter, it may permit embodiments to use chip inductors for the buck converter even with relatively high input voltage (e.g., 12 volts (V)). For example, the charge-pump converter may step down the input voltage before it is provided to the buck converter. Allowing the buck converter to operate using a stepped-down voltage may reduce the demands on its associated inductor such that a smaller chip inductor may be used instead of a larger inductor that takes up additional space.

Disclosed embodiments may include additional benefits. As one example, disclosed embodiments may utilize the inductor to bring the power nodes of the converter to the edge, which may free up periphery space on the PCB. This mechanism of routing power can reduce the number of layers on the PCB or module to route all signals.

As another example, disclosed embodiments may place output terminals of the buck converters in a way that permits the use of coupled inductors. Instead of radially routing power and placing output terminals at diametrically opposed positions to reduce parasitic effects, disclosed embodiments may locate buck converter output terminals adjacently along the same edge of the converter. For example, by placing four voltage output terminals on the four corners of the circuit layout, radial designs may limit the feasibility of connecting the output terminals to increase output amperage supply. Disclosed embodiments may address this issue by placing the output terminals adjacent and routing current vertically. Placing the output terminals in proximity allows for connecting two or more output terminals to supply additional current to a load more easily. Having output nodes of the buck converters adjacent on the same side of the device may also advantageously allow for the use of a coupled inductor. For example, with multiple voltage outputs from buck converters on the same die, two or more outputs may be connected to the same coupled inductor. This arrangement may not be possible when the inductor connection locations are radially dispersed. Moreover, using a coupled inductor may reduce the overall inductor size requirements, offering the further advantage of saving space.

While embodiments of the present disclosure may address these challenges and provide these benefits, the stated problems and features are intended to be examples and not limit the claims or scope of this disclosure. Indeed, the disclosed embodiments may address challenges and provide benefits not explicitly enumerated.

FIG. 1 is a diagram of exemplary apparatus 100 for power conversion, in accordance with disclosed embodiments. As shown in FIG. 1, apparatus 100 may include an integrated circuit 110, a circuit board 120, and inductors 131, 132, 133, and 134. Integrated circuit 110 may include power conversion circuits and may be coupled to circuit board 120 for power conversion. Circuit board 120 may include circuits (not shown) for fan-out signals from integrated circuit 110. Inductors 131, 132, 133, and 134 may be coupled to circuit board 120 and electrically connected to integrated circuit 110 to form four buck converters, shown as BUCKs 1, 2, 3, and 4 in FIG. 1. The four buck converters may convert an input power $V_{IN}$ to output power $V_{OUT-1}$, $V_{OUT-2}$, $V_{OUT-3}$, and $V_{OUT-4}$, respectively.

Inductors 131, 132, 133, and 134 may be chip inductors that may feature a small package and may be used for various applications, including power conversion and high-frequency circuitry. A chip inductor may be an inductor that comes in the form factor of a chip for use in an integrated circuit of an electronic device. Chip inductors may be used in power converters, RF transceivers, computers, and other electronic devices. An example chip inductor may include a ferrite core with a wire winding or may have multiple layers of wires. Chip inductors may offer the benefits of converting voltage and may be used to form filter circuits and resonant circuits. As compared with conventional discrete inductors, chip inductors may be more compact and may weigh less.

As shown in FIG. 1, integrated circuit 110 may include a charge-pump converter to step down input voltage $V_{IN}$. The charge-pump converter may be arranged between input voltage $V_{IN}$ and four buck converters BUCKs 1, 2, 3, and 4. The charge-pump converter may step down input voltage $V_{IN}$ (e.g., 12 V) before it is provided to buck converters BUCKs 1, 2, 3, and 4. A stepped-down voltage may reduce the demands on inductors 131, 132, 133, and 134. In some embodiments, inductors 131, 132, 133, and 134 may therefore be implemented by chip inductors instead of larger inductors that take up additional space.

During power conversion, currents may flow from integrated circuit 110 to inductors 131, 132, 133, and 134 through a plurality of conductive lines (not shown in FIG. 1) of circuit board 120. The conductive lines may extend along a direction perpendicular to a surface of circuit board 120, as explained below. Thus, the currents may be vertical to the surface of circuit board 120 and therefore vertical to circuits on circuit board 120, such as the circuits for fan-out signals. This may result in low parasitics, such as parasitic capacitors and parasitic inductors, from those circuits on circuit board 120. Apparatus 100 may convert power with low parasitics and provide efficient power conversion.

In some embodiments, integrated circuit 110 of apparatus 100 may include the charge-pump converter (FIG. 1) for two or more charge-pumps (not shown). Integrated circuit 110 may also include buck converter circuitry for at least two buck converters, e.g., at least two of buck converters BUCKs 1, 2, 3, and 4 (FIG. 1). At least two of inductors 131, 132, 133, and 134 may include chip inductors. The at least two buck converters (e.g., BUCKs 1 and 2 (FIG. 1)) may be individually connected to respective ones of the at least two chip inductors (e.g., inductors 131 and 132 (FIG. 1)) through respective ones of the conductive lines (e.g., conductive lines 121a and 121b (FIG. 2F)).

Figure 2A:
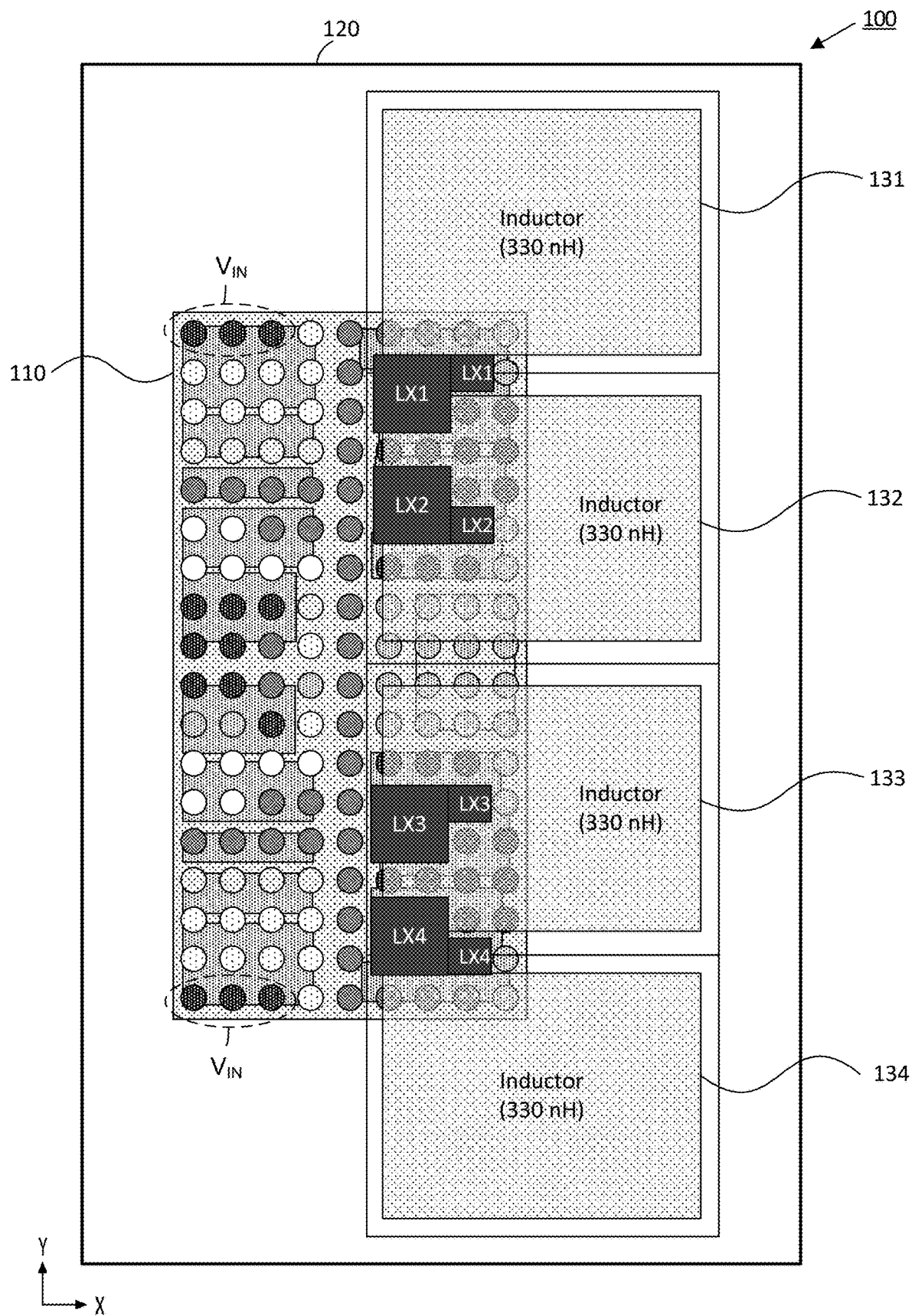
FIG. 2A is a top view of the exemplary apparatus for power conversion, in accordance with embodiments of the present disclosure.

FIG. 2A is a top view of exemplary apparatus 100 for power conversion in FIG. 1, in accordance with disclosed embodiments. As shown in FIG. 2A, apparatus 100 may include integrated circuit 110, circuit board 120, and inductors 131, 132, 133, and 134 coupled as described above with reference to FIG. 1. Inductors 131, 132, 133, and 134 each may have 330 nanohenry (nH). In some embodiments, inductors 131, 132, 133, and 134 each may have 100 nH, 200 nH, 470 nH, or other values.

Integrated circuit 110 may be packaged by, for example, a ball grid array (BGA) package and may include a plurality of conductor balls for input and output signals. Among these conductor balls, integrated circuit 110 may include a first plurality of conductor balls LX1 (FIG. 2B) to output currents to inductor 131, a second plurality of conductor balls LX2 (FIG. 2B) to output currents to inductor 132, a third plurality of conductor balls LX3 (FIG. 2B) to output currents to inductor 133, and a fourth plurality of conductor balls LX4 (FIG. 2B) to output currents to inductor 134. That is, conductor balls LX1, LX2, LX3, and LX4 may be output terminals of integrated circuit 110 to output currents, through the conductive lines of circuit board 120, to inductors 131, 132, 133, and 134.

In FIG. 2A, regions LX1, LX2, LX3, and LX4 may indicate that conductor balls LX1, LX2, LX3, and LX4 of integrated circuit 110 may be in these regions. In other words, output terminals of integrated circuit 110, e.g., conductor balls LX1, LX2, LX3, and LX4, may be beneath inductors 131, 132, 133, and 134. Thus, at least a portion of integrated circuit 110, including conductor balls LX1, LX2, LX3, and LX4 and inside circuits connected therefrom, may be beneath inductors 131, 132, 133, and 134.

As shown in FIG. 2A, the output terminals for outputting currents, e.g., conductor balls LX1, LX2, LX3, and LX4, may be within a right-hand half of integrated circuit 110. Integrated circuit 110 may also include a plurality of conductor balls $V_{IN}$ to receive input power. Conductor balls $V_{IN}$ are input terminal of integrated circuit 110 and may be within a left-hand half of integrated circuit 110 in FIG. 2A. In some embodiments, the output terminals for outputting currents may be within a left-hand half, upper half, or lower half of integrated circuit 110. The conductor balls may be within a right-hand half, lower half, or upper half of integrated circuit 110, respectively.

In some embodiments, the conductive lines may be located on a common edge of the circuit board. For example, as shown in FIG. 2A, the output terminals for outputting currents, e.g., conductor balls LX1, LX2, LX3, and LX4, may be arranged along a few lines of the ball grid array. When integrated circuit 110 is mounted to circuit board 120, output terminals for outputting currents may be mounted on an edge of circuit board 120 for easily connecting to inductors 131, 132, 133, and 134. In these embodiments, the conductive lines may be on the edge of circuit board 120.

Figure 2B:
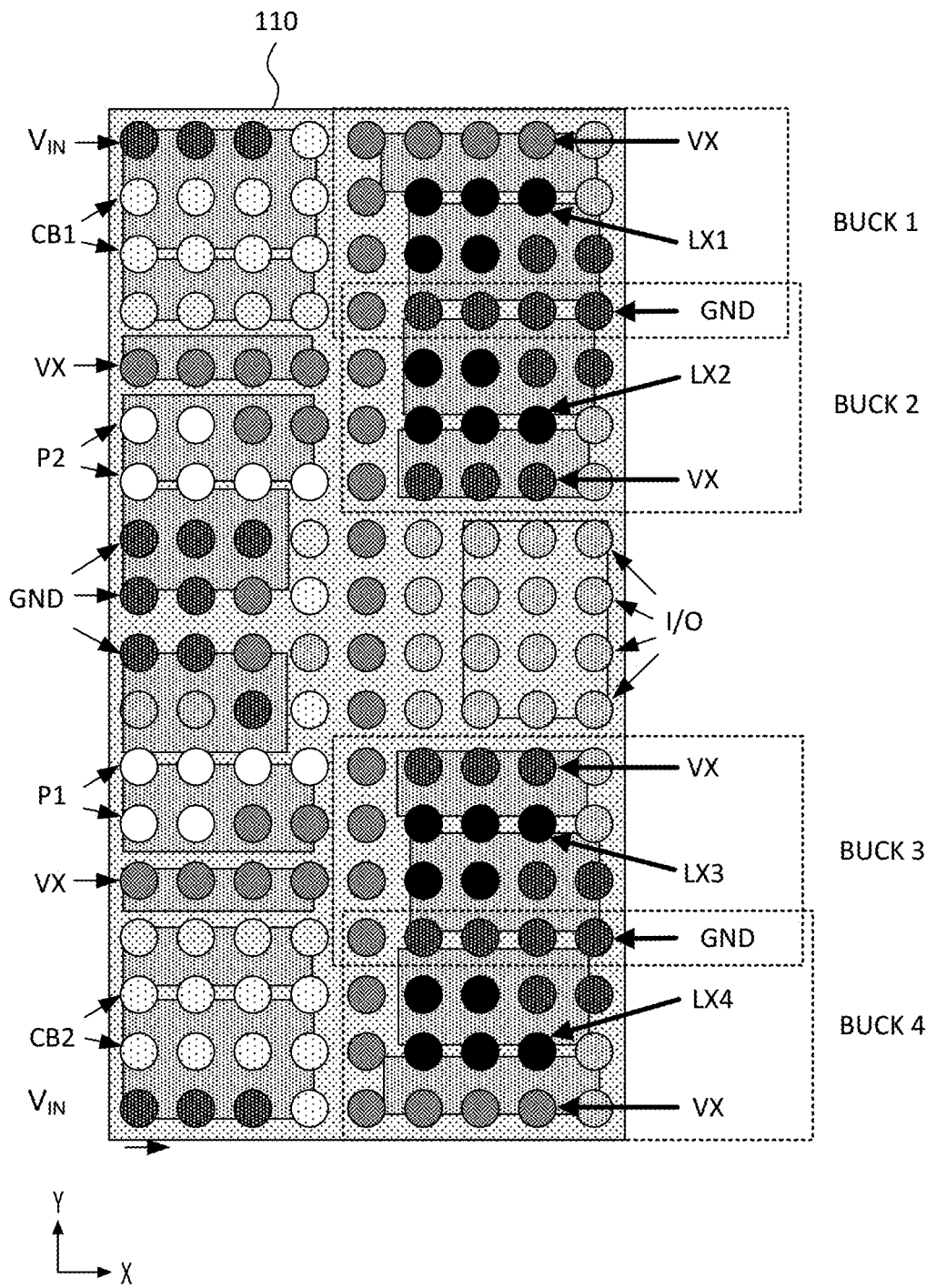
FIG. 2B is a view of an exemplary integrated circuit for power conversion in FIG. 2A, in accordance with embodiments of the present disclosure.
Figure 13:
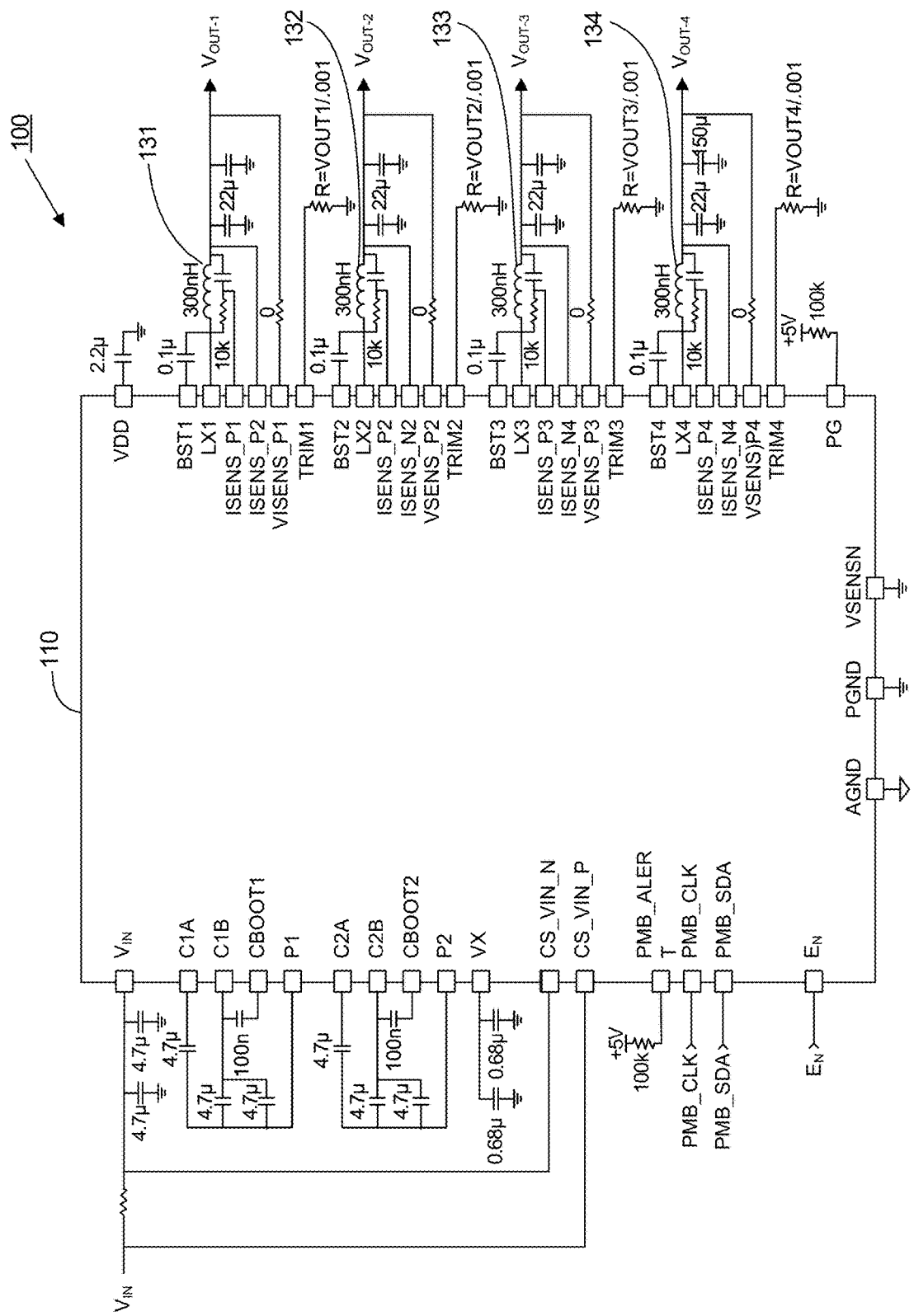
FIG. 13 is a circuit diagram of the exemplary apparatus for power conversion in FIG. 1, in accordance with embodiments of the present disclosure.

FIG. 2B is a view of exemplary integrated circuit 110 for power conversion in FIG. 2A, in accordance with disclosed embodiments. As shown in FIG. 2B, integrated circuit 110 may include a plurality of conductor balls $V_{IN}$, a plurality of conductor balls CB1, a plurality of conductor balls VX, a plurality of conductor balls P2, a plurality of conductor balls GND, a plurality of conductor balls P1, a plurality of conductor balls CB2, conductor balls LX1, LX2, LX3, and LX4, and a plurality of conductor balls I/O. In FIG. 2B, these conductor balls without reference labels may be used for the same functions as those labelled ones having the same patterns. These conductor balls are input and output terminals of integrated circuit 110 and may be coupled to peripheral circuits for power conversion as shown in FIG. 13.

In FIG. 2B, conductor balls LX1, LX2, LX3, and LX4, and VX corresponding to four buck converters are also illustrated by dashed-line blocks BUCKs 1, 2, 3, and 4. Those conductor balls LX1 and VX within dashed-line block Buck 1 may be used for buck converter BUCK 1. Those conductor balls LX2 and VX within dashed-line block Buck 2 may be used for buck converter BUCK 2. Those conductor balls LX3 and VX within dashed-line block BUCK 3 may be used for buck converter BUCK 3. Those conductor balls LX4 and VX within dashed-line block BUCK 4 may be used for buck converter BUCK 4.

As shown in FIG. 2B, output terminals for outputting currents, including conductor balls LX1, LX2, LX3, and LX4, may be arranged in those portions within dashed-line blocks BUCKs, 1, 2, 3, and 4. These portions of integrated circuit 110 may be beneath inductors 131, 132, 133, and 134 (FIG. 2A or 2D).

In another aspect, as shown in FIG. 2B, output terminals for outputting currents, including conductor balls LX1, LX2, LX3, and LX4, may be placed adjacently along the same edge of integrated circuit 110. This may allow for connecting two or more of the output terminals to supply additional current to a load more easily. Having outputting terminals, including conductor balls LX1, LX2, LX3, and LX4, adjacent on the same side of integrated circuit 110 and/or apparatus 100 may also advantageously allow for the use of coupled inductors for different configurations, as illustrated below with reference to FIG. 12.

Figure 2C:
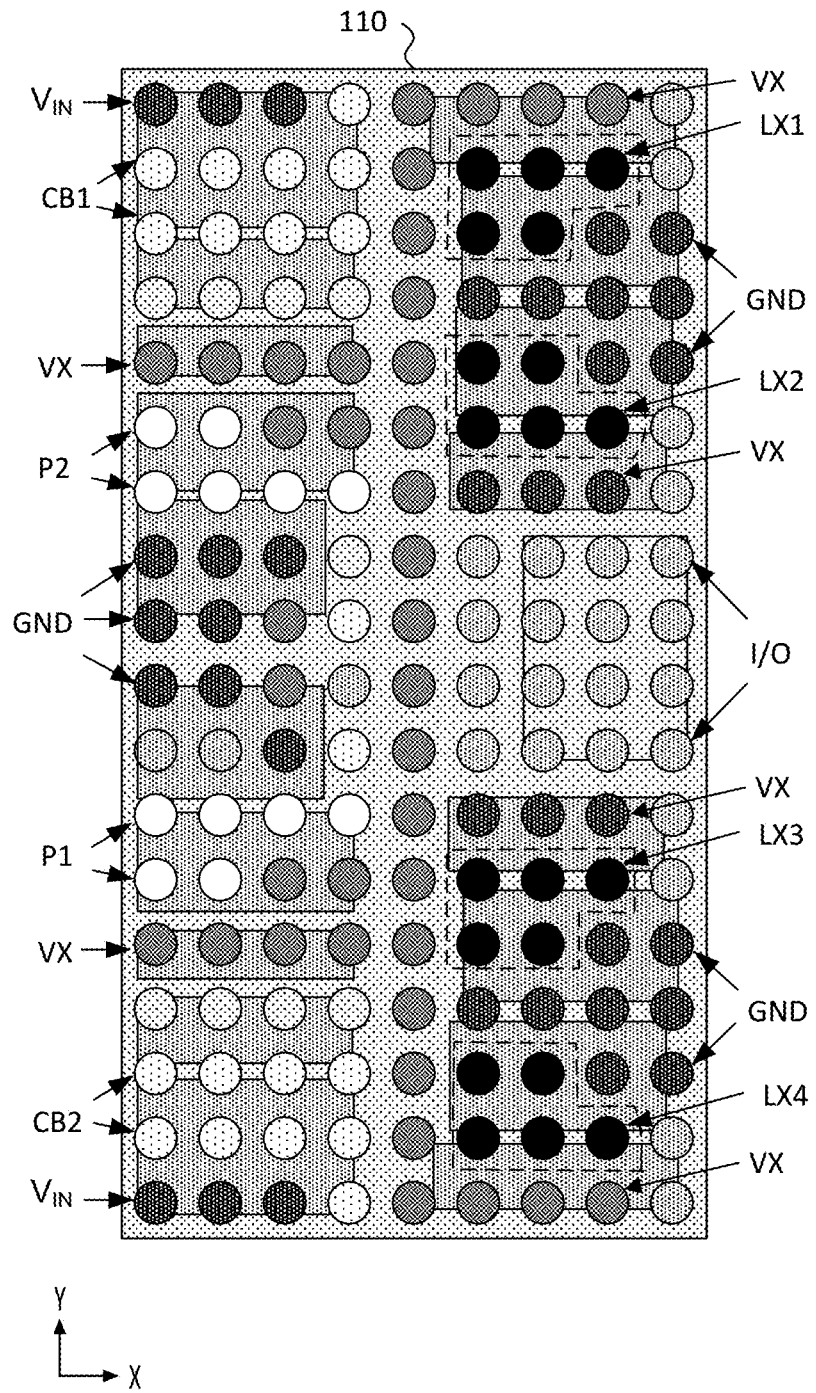
FIG. 2C is a view of exemplary input and output terminals of the exemplary integrated circuit in FIG. 2B, in accordance with embodiments of the present disclosure.

FIG. 2C is a view of exemplary input and output terminals of exemplary integrated circuit 110 for power conversion in FIG. 2B, in accordance with disclosed embodiments. As shown in FIG. 2C, input and output terminals of integrated circuit 110 may include conductor balls $V_{IN}$, conductor balls CB1, conductor balls VX, conductor balls P2, conductor balls GND, conductor balls P1, conductor balls CB2, conductor balls LX1, LX2, LX3, and LX4, and conductor balls I/O. In FIG. 2C, those conductor balls without reference labels may be used for the same purposes as those labelled ones having the same patterns.

Figure 2D:
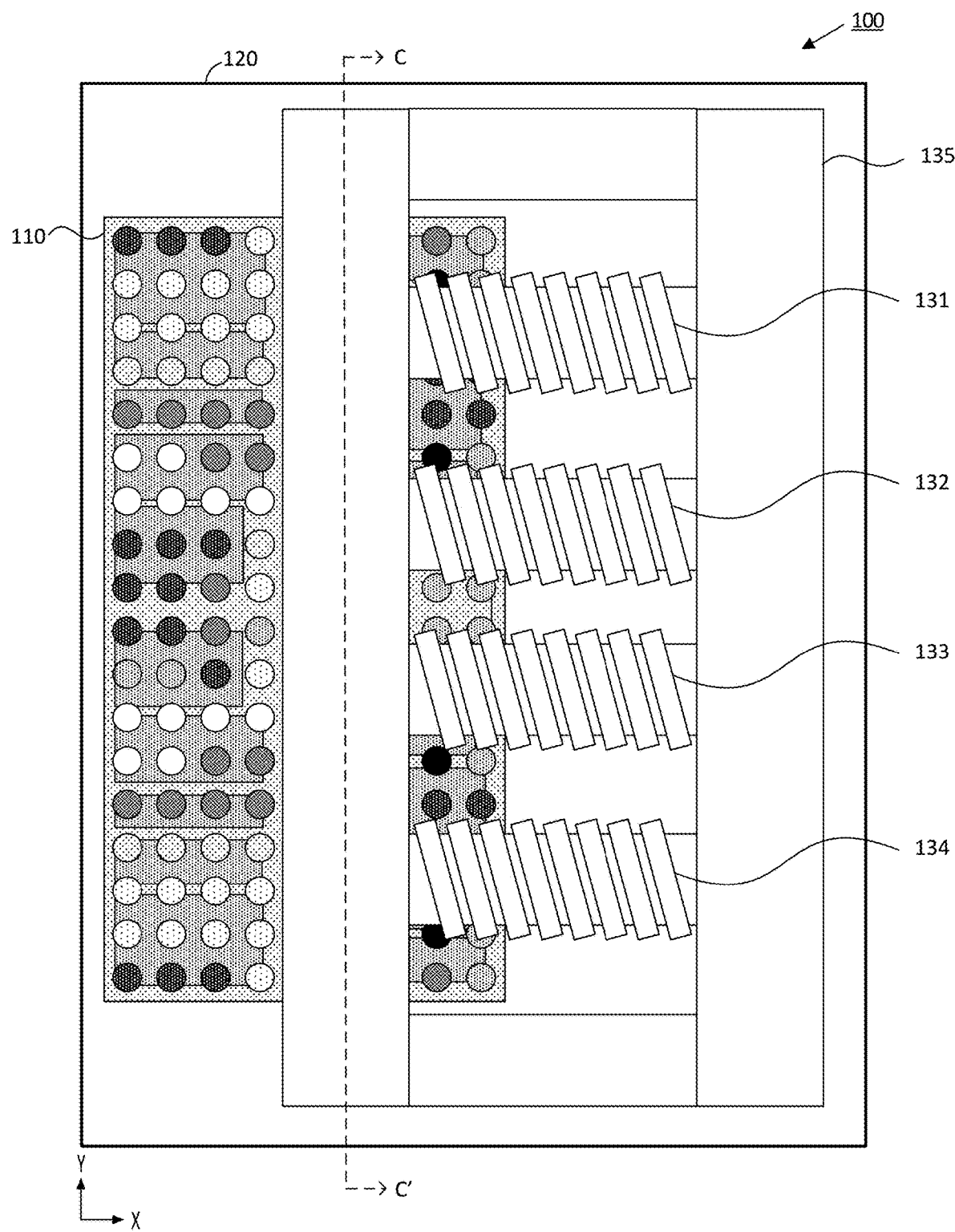
FIG. 2D is another top view of the exemplary apparatus for power conversion in FIG. 1, in accordance with embodiments of the present disclosure.

FIG. 2D is another top view of exemplary apparatus 100 for power conversion in FIG. 1, in accordance with disclosed embodiments. As shown in FIG. 2D, apparatus 100 may include integrated circuit 110, circuit board 120, and inductors 131, 132, 133, and 134 coupled as described above with reference to FIG. 1. Inductors 131, 132, 133, and 134 may share an inductor core 135 and therefore may be coupled together as a coupled inductor. Inductors 131, 132, 133, and 134 may be coupled for various configurations, as described below with reference to FIG. 12. A coupled inductor has two or more windings on a common core. Coupled inductors function in dc-dc converters by transferring energy from one winding to the other through the common core. By coupling two or more inductors, a power converter may efficiently provide the required output voltages and/or currents.

As shown in FIG. 2D, at least a portion of integrated circuit 110 may be beneath inductors 131, 132, 133, and 134.

Figure 2E:
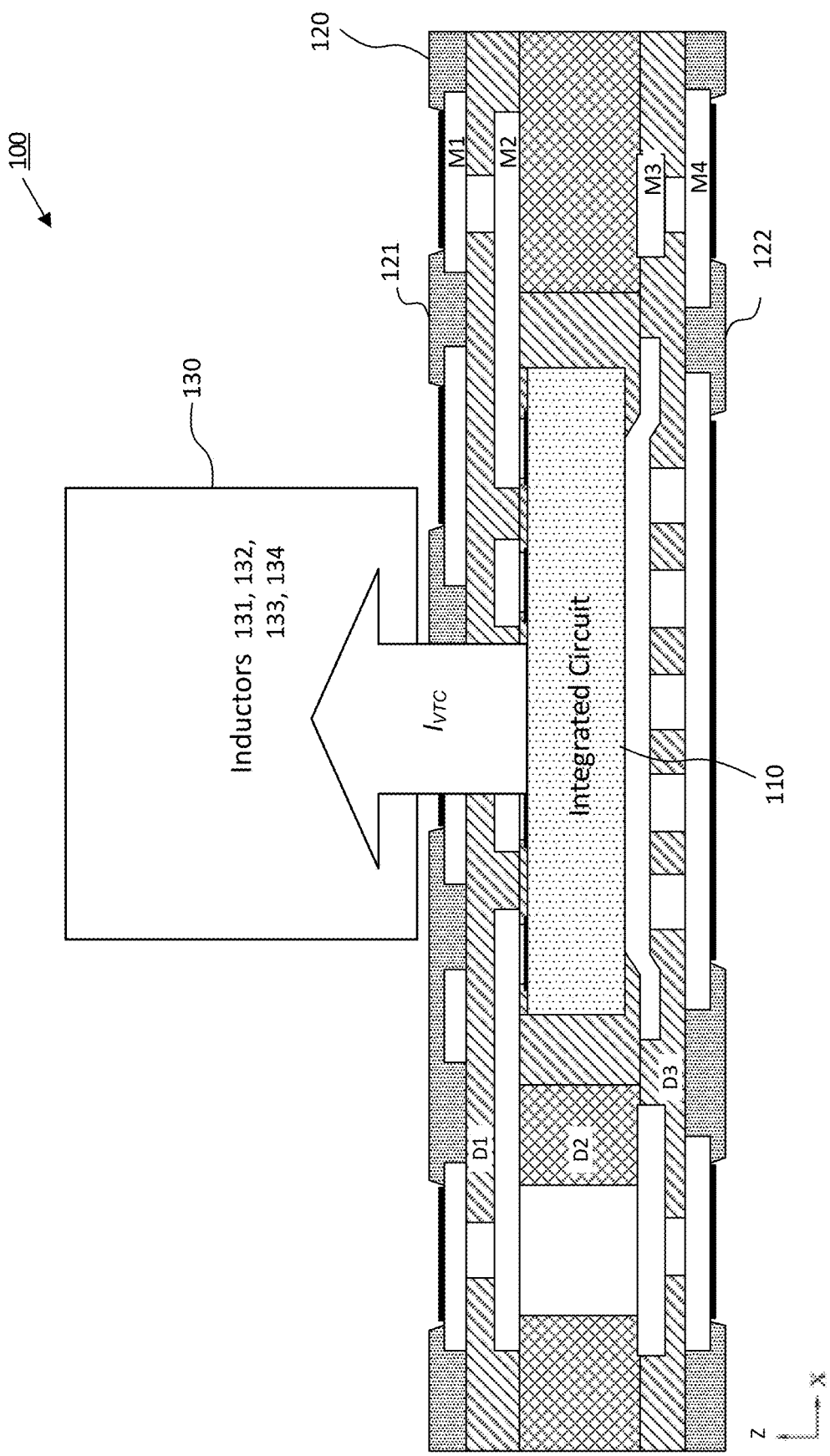
FIG. 2E is a sectional view of the exemplary apparatus for power conversion in FIG. 1, in accordance with embodiments of the present disclosure.

FIG. 2E is a sectional view CC' of exemplary apparatus 100 in FIG. 1, in accordance with disclosed embodiments. As shown in FIG. 2E, apparatus 100 for power conversion may include integrated circuit 110, circuit board 120, and an inductor 130. Inductor 130 may include inductors 131, 132, 133, and 134.

Integrated circuit 110 is a part of the power converter and may be mounted to circuit board 120. Integrated circuit 110 may be coupled to a plurality of conductive lines (FIG. 2F) of circuit board 120 to transmit a plurality of vertical currents $I_{VTC}$ to inductor 130. As shown in FIG. 2E, vertical currents $I_{VTC}$ may be vertical to, for example, a surface 121 of circuit board 120. In one example, vertical currents $I_{VTC}$ may be 4A, 8A, or 16A.

Circuit board 120 may include surfaces 121 and 122, metal layers M1, M2, M3, and M4, and a plurality of conductive lines between metal layers M1 and M2 and between metal layers M3 and M4. Surfaces 121 and 122 are two sides of circuit board 120. The conductive lines between metal layers M1 and M2 (FIG. 2F) may extend along a direction perpendicular to surface 121 of circuit board 120. Inductor 130 may be mounted on surface 121 of circuit board 120 and may be electrically coupled to integrated circuit 110 through the conductive lines between metal layers M1 and M2. As shown in FIG. 2E, at least a portion of integrated circuit 110 may be beneath inductor 130.

As noted above, vertical currents $I_{VTC}$ may be vertical to, for example, surface 121 of circuit board 120. Apparatus 100 may receive, generate, and operate using high current. The power delivery and operation at high current may be susceptible to parasitic losses that reduce power conversion efficiency of buck converters BUCKs 1, 2, 3, and 4. Also, the size of integrated circuit 110 may be small as compared to inductors, prompting signals to be fanned out on circuit board 120 and be routed as needed. This may exacerbate parasitic effects on apparatus 100. The arrangement of vertical currents $I_{VTC}$ may reduce such negative parasitic affects. By reducing parasitic effects, apparatus 100 may convert power efficiently. In some embodiments, using vertical currents $I_{VTC}$ between integrated circuit 110 and inductor 130 may also facilitate adjacently placing output terminals, including conductor balls LX1, LX2, LX3, and LX4. Adjacently placing the output terminals may allow the use of coupled inductors for different configurations of apparatus 100 for power conversion. It may also allow the use of a chip inductors, thereby reducing the size of apparatus 100.

Figure 2F:
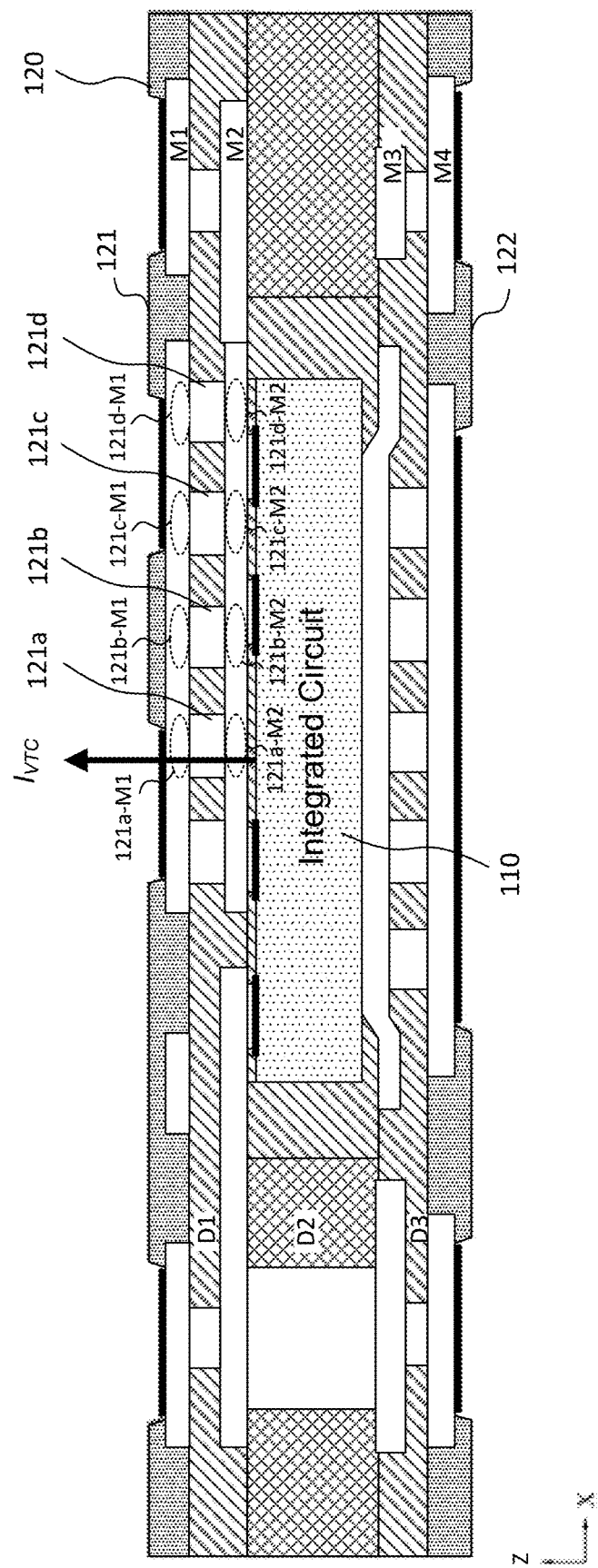
FIG. 2F is a sectional view of the exemplary integrated circuit and circuit board for power conversion in FIG. 2E, in accordance with embodiments of the present disclosure.

FIG. 2F is a sectional view of exemplary integrated circuit 110 and circuit board 120 in FIG. 2E, in accordance with disclosed embodiments. As shown in FIG. 2F, circuit board 120 may include a plurality of conductive lines 121a, 121b, 121c, and 121d from metal layer M2 to metal layer M1. Conductor balls LX1, LX2, LX3, and LX4 (FIG. 2B or 2C), i.e., output terminals of integrated circuit 110, may be directly coupled to conductive lines 121a, 121b, 121c, and 121d to output vertical currents $I_{VTC}$ to conductor 130 (FIG. 2E). As shown in FIG. 2F, conductive lines 121a, 121b, 121c, and 121d may extend directly from conductor balls LX1, LX2, LX3, and LX4, along a direction perpendicular to surface 121, and to inductor 130 (FIG. 2E).

As shown in FIGS. 2E and 2F, integrated circuit 110 may be embedded inside circuit board 120. Circuit board 120 has layers D1, D2, and D3. Layer D2 may be between layers D1 and D3. Integrated circuit 110 may be mounted in layer D2.

As shown in FIG. 2F, circuit board 120 may have metal layers M1 and M2. Conductive lines 121a, 121b, 121c, and 121d may be coupled between metal layers M1 and M2. Integrated circuit 110 may be coupled to conductive lines 121a, 121b, 121c, and 121d in metal layer M2.

In FIG. 2F, circuit board 120 may include a first plurality of terminals 121a-M1, 121b-M1, 121c-M1, and 121d-M1 on surface 121. Terminals 121a-M1, 121b-M1, 121c-M1, and 121d-M1 may be coupled to first ends of conductive lines 121a, 121b, 121c, and 121d, and may be coupled to inductor 130 (FIG. 2E). Circuit board 120 may also include a second plurality of terminals 121a-M2, 121b-M2, 121c-M2, and 121d-M2 coupled to the other ends of conductive lines 121a, 121b, 121c, and 121d in metal layer M2. Terminals 121a-M2, 121b-M2, 121c-M2, and 121d-M2 may be coupled to integrated circuit 110 for power conversion. As shown in FIG. 2F, terminals 121a-M2, 121b-M2, 121c-M2, and 121d-M2 may be beneath terminals 121a-M1, 121b-M1, 121c-M1, and 121d-M1.

As shown in FIG. 2F, conductive lines 121a, 121b, 121c, and 121d may extend directly from terminals 121a-M2, 121b-M2, 121c-M2, and 121d-M2, along the direction perpendicular to surface 121, and to terminals 121a-M1, 121b-M1, 121c-M1, and 121d-M1. Terminals 121a-M2, 121b-M2, 121c-M2, and 121d-M2 may be inside circuit board 120 in metal layer M2.

As illustrated above, circuit board 120 has layers D1, D2, and D3. Layer D2 may be between layers D1 and D3. Terminals 121a-M2, 121b-M2, 121c-M2, and 121d-M2 may be at a side of layer D2.

As shown in FIG. 2F, conductive lines 121a, 121b, 121c, and 121d may be coupled between metal layers M1 and M2. Terminals 121a-M2, 121b-M2, 121c-M2, and 121d-M2 may be in metal layer M2. Conductive lines 121a, 121b, 121c, and 121d may be configured to transmit vertical currents $I_{VTC}$ from terminals 121a-M2, 121b-M2, 121c-M2, and 121d-M2 to terminals 121a-M1, 121b-M1, 121c-M1, and 121d-M1. Vertical currents $I_{VTC}$ may flow along the direction perpendicular to surface 121 of circuit board 120.

Figure 3A:
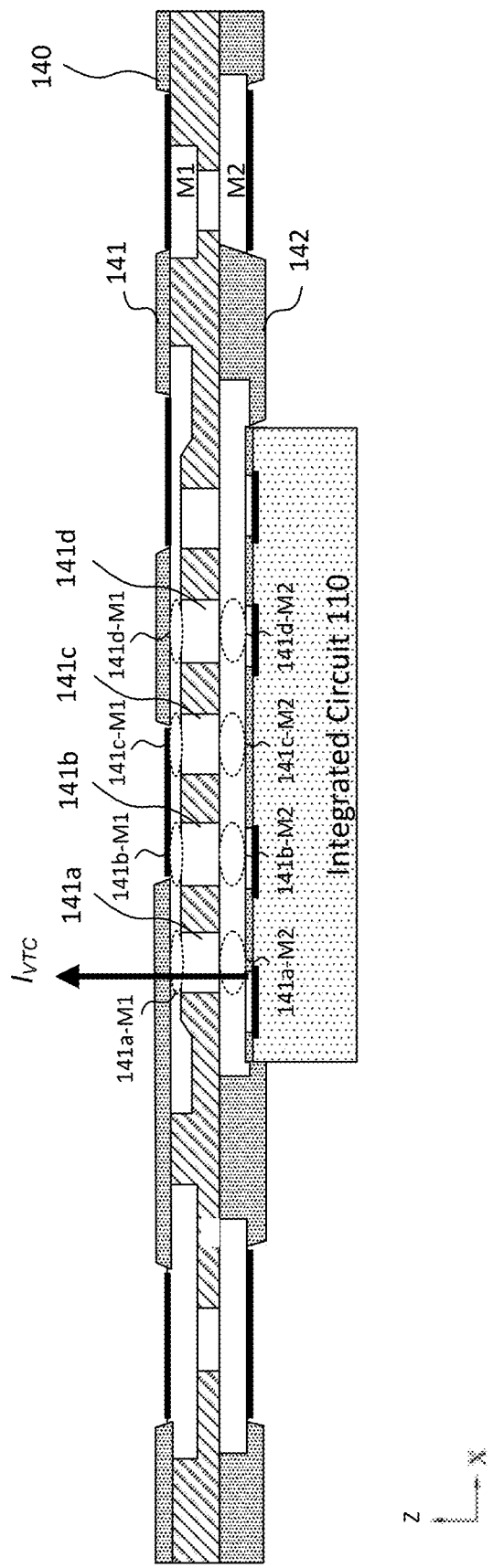
FIG. 3A is a sectional view of another exemplary circuit board and integrated circuit for power conversion, in accordance with embodiments of the present disclosure.

FIG. 3A is a sectional view of another exemplary circuit board 140 and integrated circuit 110 for power conversion, in accordance with disclosed embodiments. As shown in FIG. 3A, circuit board 140 may include surfaces 141 and 142, metal layers M1 and M2, and a plurality of conductive lines 141a, 141b, 141c, and 141d. Integrated circuit 110 may be mounted on surface 142. Conductive lines 141a, 141b, 141c, and 141d may have similar functions as conductive lines 121a, 121b, 121c, and 121d in FIG. 2F. Conductive lines 141a, 141b, 141c, and 141d may be coupled between integrated circuit 110 mounted on surface 142 and a conductor mounted on surface 141, e.g., inductor 130 (FIG. 2E).

As shown in FIG. 3A, circuit board 140 may include a first plurality of terminals 141a-M1, 141b-M1, 141c-M1, and 141d-M1 on surface 141. Terminals 141a-M1, 141b-M1, 141c-M1, and 141d-M1 may be in metal layer M1 and coupled to first ends of conductive lines 141a, 141b, 141c, and 141d. Terminals 141a-M1, 141b-M1, 141c-M1, and 141d-M1 may be coupled to an inductor (e.g., inductor 130 (FIG. 2E)) on surface 141. Circuit board 120 may also include a second plurality of terminals 141a-M2, 141b-M2, 141c-M2, and 141d-M2 in metal layer M2. Terminals 141a-M2, 141b-M2, 141c-M2, and 141d-M2 may be coupled to the other ends of conductive lines 141a, 141b, 141c, and 141d. Terminals 141a-M2, 141b-M2, 141c-M2, and 141d-M2 may be on surface 142 and coupled to integrated circuit 110. As shown in FIG. 3A, terminals 141a-M2, 141b-M2, 141c-M2, and 141d-M2 may be beneath terminals 141a-M1, 141b-M1, 141c-M1, and 141d-M1.

Conductive lines 141a, 141b, 141c, and 141d may be configured to transmit vertical currents $I_{VTC}$ from terminals 141a-M2, 141b-M2, 141c-M2, and 141d-M2 on surface 142 to terminals 141a-M1, 141b-M1, 141c-M1, and 141d-M1 on surface 141. Vertical currents $I_{VTC}$ may flow along a direction perpendicular to surfaces 141 and 142, and then to an inductor (e.g., inductor 130 (FIG. 2E)).

Figure 3B:
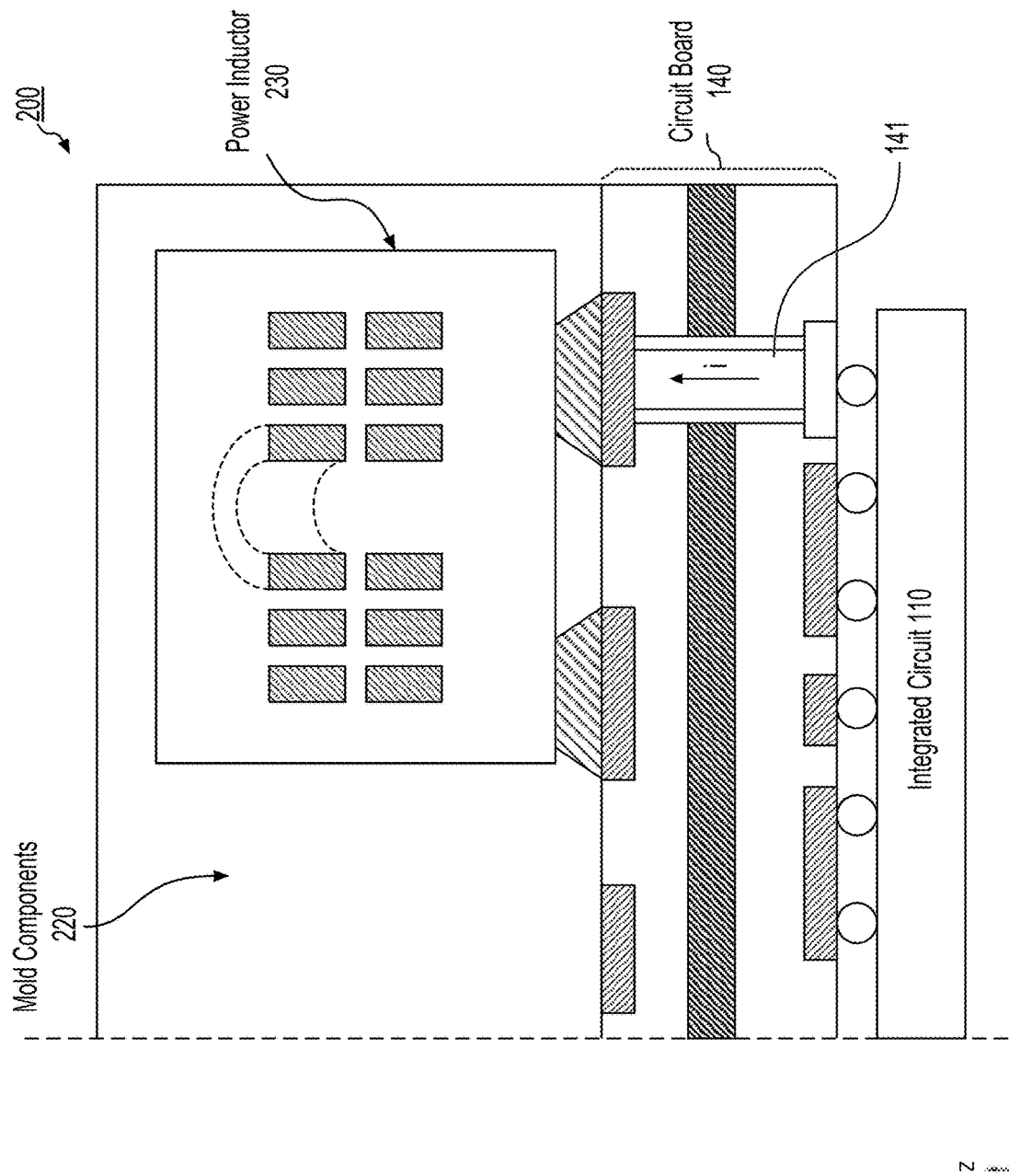
FIG. 3B is a sectional view of exemplary apparatus for power conversion, in accordance with embodiments of the present disclosure.

FIG. 3B is a sectional view of exemplary apparatus 200 for power conversion, in accordance with embodiments of the present disclosure. As shown in FIG. 3B, apparatus 200 may include integrated circuit 110 (FIG. 3A), circuit board 140 (FIG. 3A), mold components 220, and mold power inductor 230. Integrated circuit 110 may be mounted on circuit board 140 and operate as described above with reference to FIG. 3A. A conductive line 141 of circuit board 140 may include one or more of conductive lines 141a, 141b, 141c, and 141d (FIG. 3A) and may be configured to transmit vertical currents from integrated circuit 110 to mold power inductor 230. Mold components 220 may include mold capacitors and/or mold resistors that are used as capacitors and resistors in FIG. 13.

Figure 4:
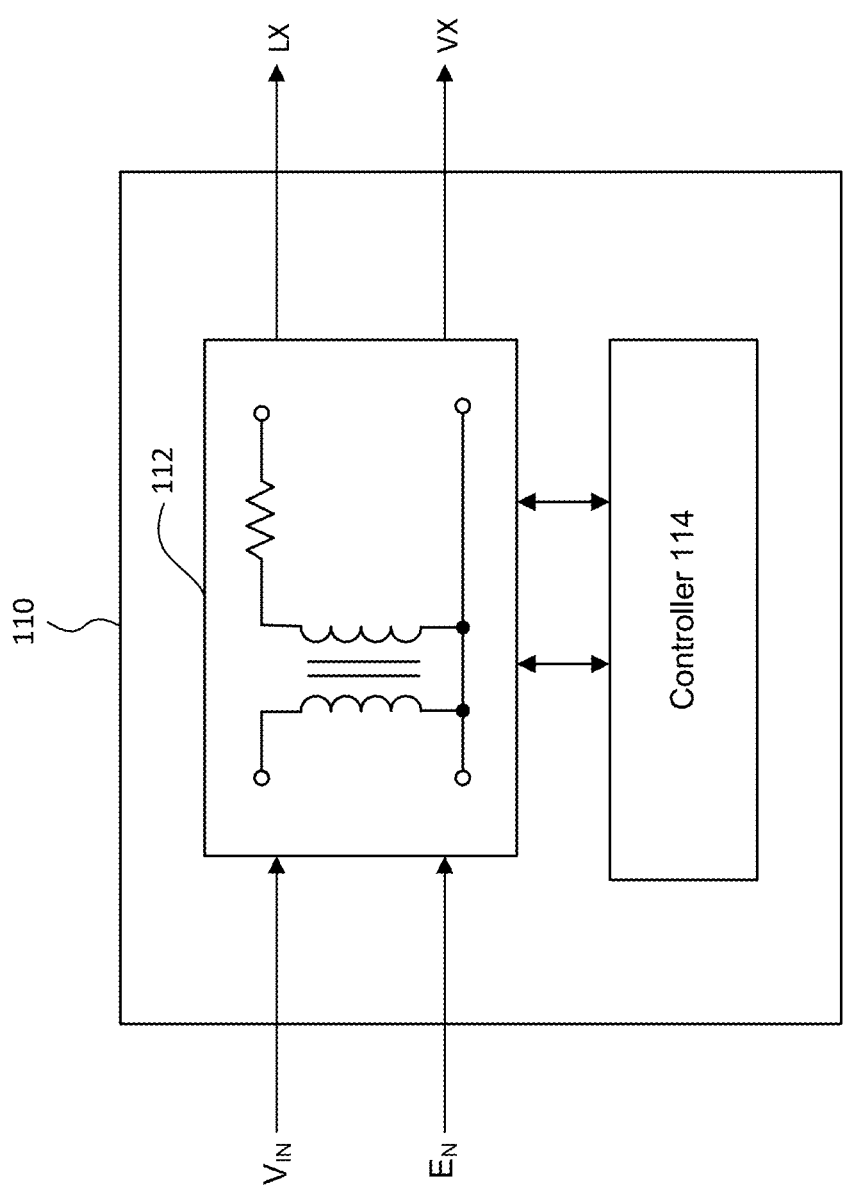
FIG. 4 is a block diagram of the exemplary integrated circuit for power conversion, in accordance with embodiments of the present disclosure.

FIG. 4 is a block diagram of exemplary integrated circuit 110 for power conversion, in accordance with disclosed embodiments. As shown in FIG. 4, integrated circuit 110 may include a transformation circuit 112 and a controller 114. Controller 114 may include circuitry configured to control a plurality of switches in transformation circuit 112 for power conversion in various configurations, as described below with reference to FIG. 12.

Figure 5A:
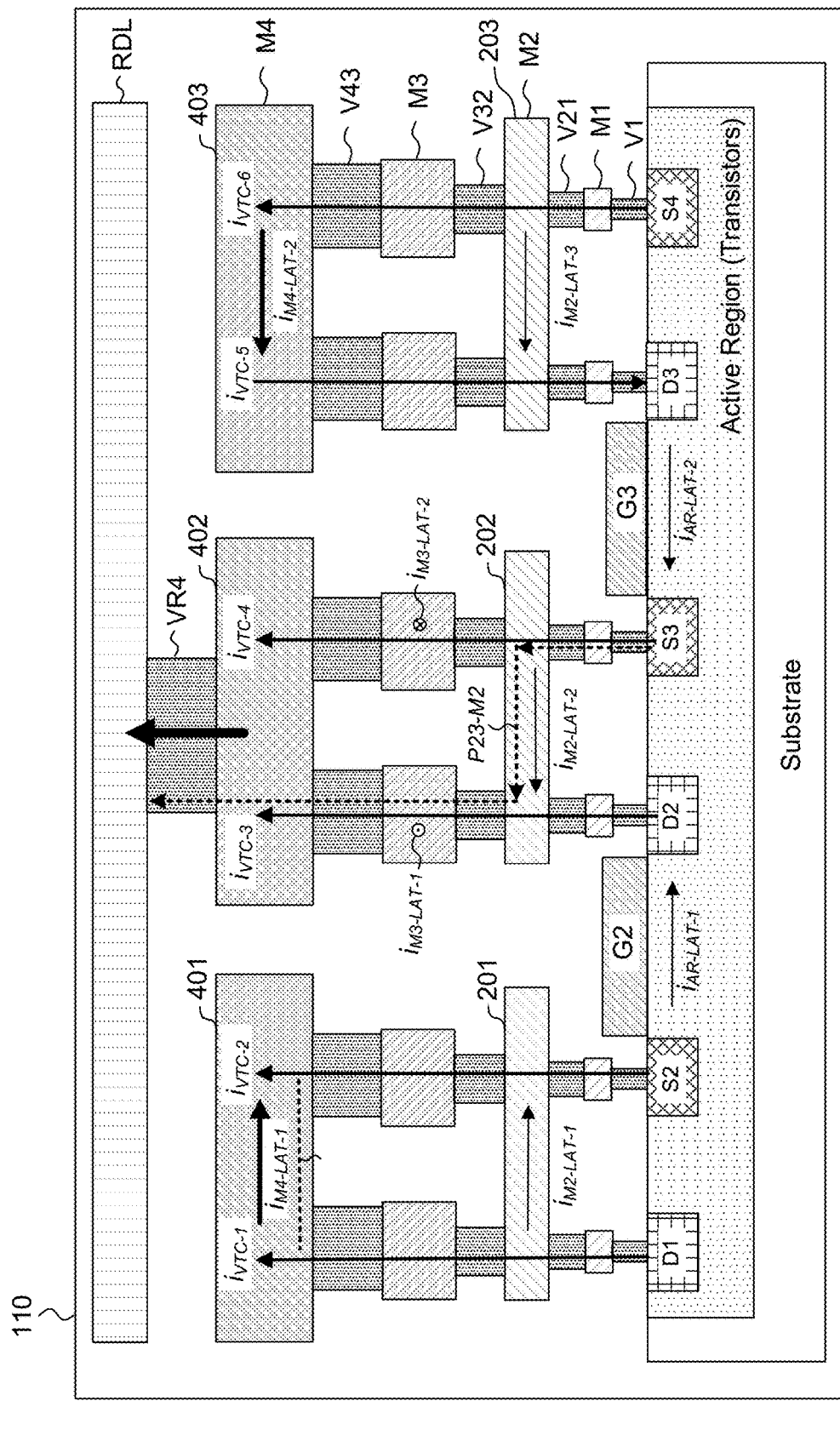
FIG. 5A is a sectional view of the exemplary integrated circuit for power conversion, in accordance with embodiments of the present disclosure.

FIG. 5A is a sectional view of exemplary integrated circuit 110 for power conversion, in accordance with disclosed embodiments. As shown in FIG. 5A, integrated circuit 110 may include a substrate, an active region (AR) in an AR layer, a plurality of six metal 1 (M1) regions in an M1 layer, three metal 2 (M2) regions 201, 202, 203 in an M2 layer, six metal 3 (M3) regions in an M3 layer, three metal 4 (M4) regions 401, 402, and 403 in an M4 layer, six vias between the six M1 regions and the active regions (V1 vias), six vias between the M2 regions and the M1 regions (V21 vias), six vias between the M3 regions and the M2 regions (V32 vias), and six vias between the M4 regions and the M3 regions (V43 vias). The AR region includes a plurality of power transistors.

When integrated circuit 110 converts input power $V_{IN}$ (FIG. 1) to $V_{OUT-1}$, $V_{OUT-2}$, $V_{OUT-3}$ and $V_{OUT-4}$, controller 114 of integrated circuit 110 may be configured to operate the transistors through horizontal currents $i_{AR-LAT}$ that flow between the transistors and through vertical currents $i_{VTC}$ from transistors to, for example, terminals 121a-M2, 121b-M2, 121c-M2, and 121d-M2 (FIG. 2F) of circuit board 120 (FIG. 2F). As shown in FIG. 5A, vertical currents $i_{VTC}$ may flow along a direction perpendicular to the substrate of integrated circuit 110. Vertical currents $i_{VTC}$ may flow, through terminals 121a-M2, 121b-M2, 121c-M2, and 121d-M2, into conductive lines 121a, 121b, 121c, and 121d (FIG. 2F) as vertical currents $I_{VTC}$ (FIG. 2F).

As shown in FIG. 5A, the power transistors in the active regions are in the AR layer. M4, M3, M2, and M1 regions are arranged in stacks, coupled together through V43, V32, V21, and V1 vias, and coupled to source and drain regions of the power transistors in the active region. The stacked M4, M3, M2, and M1 regions and V43, V32, V21, and V1 vias are vertically oriented metal conductors configured to provide a plurality of conductive paths for vertical currents $i_{VTC}$ to flow between the power transistors in the AR layer and M4 regions 401, 402, and 403 in the M4 layer within integrated circuit 110. As shown in FIG. 5A, there are six vertical currents $i_{VTC-1}$ to $i_{VTC-6}$ flowing along a Z-axis direction between the AR layer and the M4 layer.

The M4 layer is above the AR layer and is considered to be an upper layer within integrated circuit 110, as compared to the M3, M2, M1, and AR layers. In some embodiments, the M3 layer is above the AR layer and is considered to be an upper layer within integrated circuit 110, as compared to the M2, M1, and AR layers. In some embodiments, integrated circuit 110 may also include an RDL region in an RDL layer above the M4 layer. The RDL region is coupled to M4 region 402 through a via between the RDL and M4 layers (VR4 via) and extends along a Y-axis direction to redistribute currents. Integrated circuit 110 may include a plurality of terminals (e.g., VXs, LX1, LX2, LX3, and LX4 in FIG. 2C) coupled to the RDL (FIG. 5A).

As shown in FIG. 5A, many of M4, M3, M2, and M1 regions are also laterally oriented metal conductors configured to provide a plurality of conductive paths for lateral currents $i_{LAT}$ to flow. For example, There are three lateral currents $i_{M2-LAT-1}$ to $i_{M2-LAT-3}$ in the M2 layer and two lateral currents $i_{M4-LAT-1}$ and $i_{M4-LAT-2}$ in the M4 layer flowing along an X-axis direction. There are two lateral currents $i_{m3-LAT-1}$ and $i_{M3-LAT-2}$ in the M3 layer flowing along a Y-axis direction. The X-axis direction of the lateral currents $i_{M2-LAT}$ and the Y-axis direction of the lateral currents $i_{M3-LAT}$ are perpendicular to the Z-axis direction of the vertical currents $i_{VTC}$, including vertical currents $i_{VTC-1}$ to $i_{VTC-6}$.

Thus, integrated circuit 110 may include a plurality of conductive paths electrically coupled between the terminals coupled to the RDL and the power transistors in the AR layer. Each terminal may be electrically coupled to at least one of the power transistors via at least one of the conductive paths. Each conductive path comprises one or more laterally oriented metal conductors and one or more vertically oriented metal conductors. In a majority of the conductive paths of integrated circuit 110, a sum of lengths of the one or more vertically oriented metal conductors exceeds a sum of lengths of the one or more laterally oriented metal conductors.

As shown in FIG. 5A, M4 regions 401, 402, and 403 are thicker than the M3 regions. M4 regions 401, 402, and 403 therefore have lower resistances than the M3 regions. The M3 regions are thicker than M2 regions 201, 202, and 203. The M3 regions therefore have lower resistances than M2 regions 201, 202, and 203. M2 regions 201, 202, and 203 are thicker than the M1 regions. That is, a metal region in an upper layer has a lower resistance than a metal region in a lower layer. M4 regions 401, 402, and 403, six M3 regions, M2 regions 201, 202, and 203, and six M1 regions may be laterally oriented metal conductors in integrated circuit 110. That is, in integrated circuit 110, a resistance of each laterally oriented metal conductor in the M2 layer is less than a resistance of each laterally oriented metal conductor in the M1 layer. A resistance of each laterally oriented metal conductor in the M3 layer is less than the resistance of each laterally oriented metal conductor in the M2 layer. A resistance of each laterally oriented metal conductor in the M4 layer is less than the resistance of each laterally oriented metal conductor in the M3 layer.

In some embodiments, integrated circuit 110 may include the M4, M3, M2, and M1 regions as laterally oriented metal conductors for the conductive paths. That is, the laterally oriented metal conductors of integrated circuit 110 may include M1 metal conductors in the M1 layer above the power transistors and M2 metal conductors in a second metal layer above the first metal layer. The laterally oriented metal conductors may also include M3 metal conductors in the M3 layer above the second metal layer and M4 metal conductors in the M4 layer above the M3 layer. A width of the M1 metal conductors is less than a width of the M2 metal conductors. The width of the M2 metal conductors is less than a width of the M3 metal conductors. The width of the M3 metal conductors is less than a width of the M4 metal conductors.

As a result, lateral currents are more likely to occur and flow through the upper metal region than the lower region when both conductive paths through the upper region and the lower region are available. For example, a total amount of the vertical currents $i_{VTC-1}$ to $i_{VTC-6}$ may be 0.5 milliampere (mA). A total amount of the lateral currents $i_{M4-LAT-1}$, $i_{M4-LAT-2}$, $i_{M3-LAT-1}$, $i_{M3-LAT-2}$, and $i_{M2-LAT-1}$ to $i_{M2-LAT-3}$ may be 0.1 mA. The total amount (0.5 mA) of the vertical currents $i_{VTC}$ is greater than the total amount (0.1 mA) of the lateral currents $i_{M4-LAT}$, $i_{M3-LAT}$, and $i_{M2-LAT}$.

Integrated circuit 110 also includes conductor balls LX1, LX2, LX3, and LX4 (FIG. 2A) as output terminals coupled to the conductive paths (stacked M4, M3, M2, and M1 regions in FIG. 5A). Conductor balls LX1, LX2, LX3, and LX4 of integrated circuit 110 are configured to output at least a portion of the vertical currents $i_{VTC}$ (e.g., vertical currents $i_{VTC-3}$ and $i_{VTC-4}$ in FIG. 5A) to inductors 131, 132, 133, and 134 (FIG. 2A) via the RDL region (FIG. 5A).

For example, M4 regions 401, 402, 403 may have a thickness of 35 micrometers (μm), the length along the Z-axis direction. M4 regions 401, 402, and 403 may also have a width ($W_{M4}$) of 35 μm, i.e., $W_{M4}$=35 μm. The six M3 regions may have a thickness of 17 μm. The M3 regions may also have a width ($W_{M3}$) of 17 μm, i.e., $W_{M3}$=17 μm. M2 regions 201, 202, and 203 may have a thickness of 8 μm. M2 regions 201, 202, and 203 may also have a width ($W_{M2}$) of 8 μm, i.e., $W_{M2}$=8 μm. The M1 regions may have a thickness of 0.5 μm. The M1 regions may also have a width ($W_{M1}$) of 0.5 μm, i.e., $W_{M1}$=0.5 μm.

In FIG. 5A, the M1 regions are coupled to source regions S2, S3, and S4, and drain regions D1, D2, and D3 in the AR region of the power transistors. Source region S2 and drain region D2 form one of the power transistors. Source region S3 and drain region D3 also form one of the power transistors. The active region also includes a source region 51 (not shown) together with drain region D1 to form one of the power transistors. The active region also includes a drain region D4 (not shown) together with source region S4 to form one of the power transistors.

As shown in FIG. 5A, three M4 regions 401, 402, and 403 are in the M4 layer, which is above the M3, M2, M1, and AR layers of integrated circuit 110. Three M2 regions 201, 202, and 203 are in the M2 layer, which is below the M4 layer and above the AR layer. M4 regions 401, 402, and 403 (35 μm) are thicker and wider than M2 regions 201, 202, and 203 (8 μm). Thus, M4 regions 401, 402, and 403 have lower resistances than M2 regions 201, 202, and 203, and are configured to allow more currents to flow through than M2 regions 201, 202, and 203 do. That is, lateral current $i_{M4-LAT-1}$ flowing through M4 region 401 is greater than lateral current $i_{M2-LAT-1}$ flowing through M2 region 201. Lateral current $i_{M4-LAT-2}$ flowing through M4 region 403 is greater than lateral current $i_{M2-LAT-3}$ flowing through M2 region 203. As described above, M4 regions 401, 402, and 403 and M2 regions 201, 202, and 203 are laterally oriented metal conductors. That is, a current flowing in each laterally oriented M4 metal conductor in the M4 layer may exceed a current flowing in each laterally oriented M2 conductor in the M2 layer. The current flowing in each laterally oriented M4 metal conductor in the M4 layer may also exceed a current flowing in each laterally oriented M3 conductor in the M3 layer. The current flowing in each laterally oriented M2 metal conductor in the M2 layer may also exceed a current flowing in each laterally oriented M1 conductor in the M1 layer.

In some embodiments, a total amount of two lateral currents $i_{M4\text{-}LAT\text{-}1}$ and $i_{M4\text{-}LAT\text{-}2}$ flowing in the M4 layer is greater than a total amount of two lateral currents $i_{M2\text{-}LAT\text{-}1}$ and $i_{M2\text{-}LAT\text{-}3}$ flowing in the M2 layer. Lateral current $i_{M2\text{-}LAT\text{-}2}$ flowing through M2 region 202 may be little because vertical currents $i_{VTC\text{-}3}$ and $i_{VTC\text{-}4}$ are formed directly from the AR region to M4 region 402. Two conductive paths directly from drain region D2 to M4 region 402 and directly from source region S3 to M4 region 402 have lower resistances than a conductive path from the AR region (S3 or D2), through M2 region 202 forming $i_{M2\text{-}LAT\text{-}2}$, to M4 region 402.

As shown in FIG. 5A, there is a conductive path P23-M2 that starts from source region S3 of the third transistor and extends to the terminal (not shown) coupled to the RDL via M2 region 202 in the M2 layer. Conductive path P23-M2 includes a first plurality of vertically oriented metal conductors, including stacked V1, M1, V21, and a part of M2; a laterally oriented metal conductor on M2 region 202; and a second plurality of vertically oriented metal conductors, including stacked part of M2, V32, M3, V43, M4, and VR4. A sum of lengths of the first and second plurality of vertically oriented metal conductors exceeds a length of the laterally oriented metal conductor.

As shown in FIG. 5A, integrated circuit 110 includes a first plurality of metal regions coupled to source regions of the power transistors. Integrated circuit 110 also includes a second plurality of metal regions coupled to drain regions of the power transistors. The first plurality and second plurality of metal regions have at least one of substantially equal numbers of metal regions, substantially equal resistances, or balanced distributions of metal regions. That is, a number of M4, M3, M2, and M1 regions coupled to the source regions of the power transistors is substantially equal to a number of M4, M3, M2, and M1 regions coupled to the drain regions of the power transistors. A first plurality of stacked metal regions forming a first conductive path from a source region to a first M4 region has a substantial equal resistance as a second plurality of stacked metal regions forming a second conductive path from a drain region to a second M4 region. The first and second M4 regions may be the same M4 region or different M4 regions.

In some embodiments, integrated circuit 110 includes a plurality of active regions. Each of the active regions is similar to the active region in FIG. 5A. One or more RDL, M4, M3, and M2 regions may cross over one or more active regions.

Figure 5B:
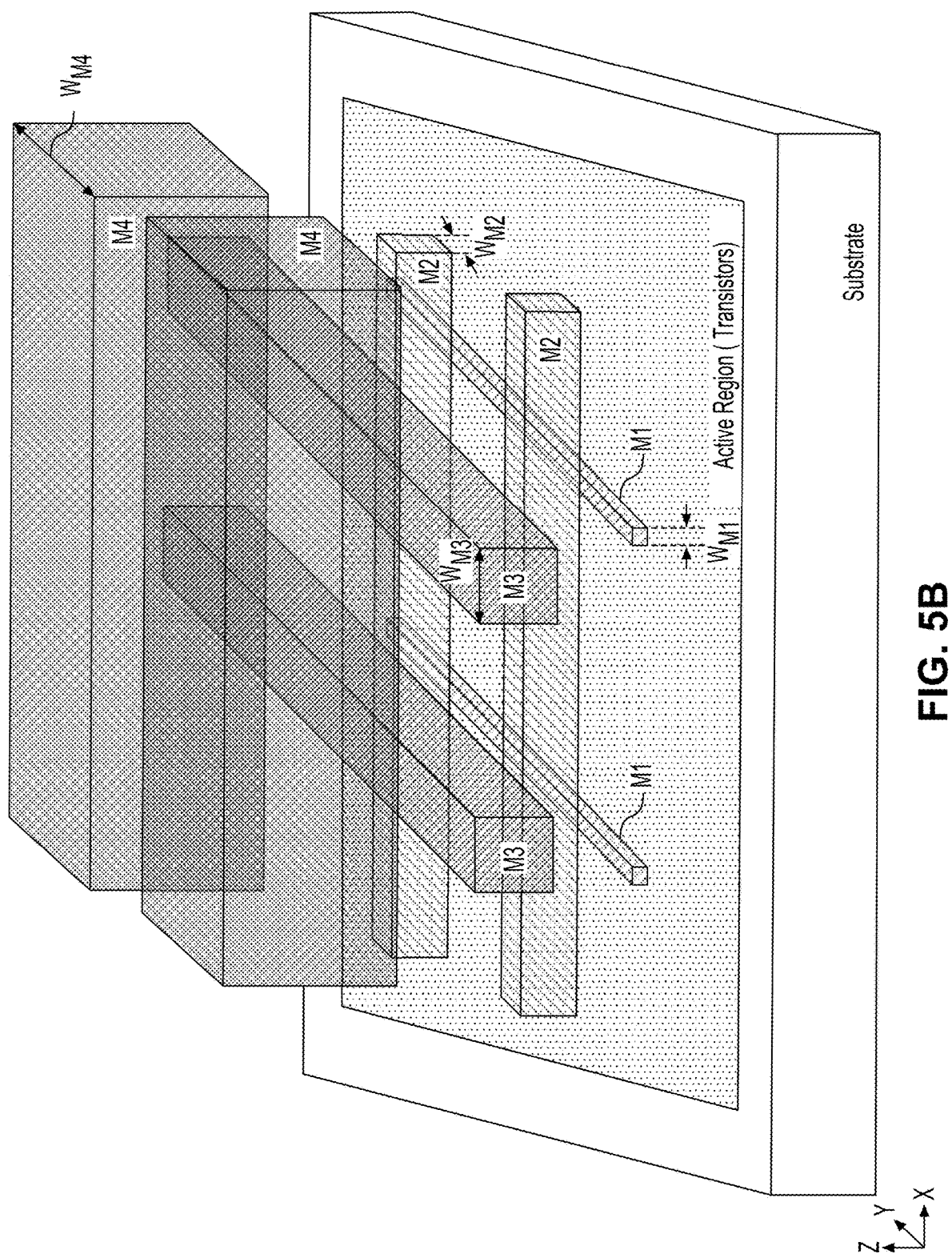
FIG. 5B is a perspective view of metal regions of the exemplary integrated circuit for power conversion, in accordance with embodiments of the present disclosure.

FIG. 5B is a perspective view of metal regions of integrated circuit 110 for power conversion, in accordance with embodiments of the present disclosure. As shown in FIG. 5B, integrated circuit 110 includes two M4 regions, two M3 regions, two M2 regions, two M1 regions, and a substrate with an active region. The active region includes a plurality of power transistors (not shown). Integrated circuit 110 has cross metal wire orientation. Two M4 regions have a width $W_{M4}=35$ μm and extend along the X-axis direction. Two M3 regions have a width $W_{M3}=17$ μm and extend along the Y-axis direction. Two M2 regions have a width $W_{M2}=8$ μm and extend along the X-axis direction. Two M1 regions have a width $W_{M1}=0.5$ μm and extend along the Y-axis direction.

In some embodiments, an exemplary integrated circuit for power conversion may have a plurality of metal regions. The plurality of metal regions may include a plurality of first metal regions in a first layer. The first metal regions may have a first width. The plurality of metal regions may also include a plurality of second metal regions in a second layer. The second metal regions may have a second width. The second layer may be above the first layer. The second width is greater than the first width.

For example, integrated circuit 110 in FIGS. 5A and 5B may include a plurality of M4, M3, M2, and M1 regions. That is, the metal regions of integrated circuit 110 have the M2 regions in the M2 layer. The M2 regions have the width $W_{M2}=8$ μm. The metal regions of integrated circuit 110 also have the M3 regions in the M3 layer. The M3 regions have the width $W_{M3}=17$ μm. The M3 layer is above the M2 layer. The width (17 μm) of the M3 regions is greater than the width (8 μm) of the M2 regions. The width (17 μm) of the M3 regions is about twice the width (8 μm) of the M2 regions.

In some embodiments, the plurality of metal regions of the exemplary integrated circuit for power conversion may further include a plurality of third metal regions in a third layer. The third metal regions have a third width. The third layer is above the second layer. The third width is greater than the second width.

For example, the metal regions of integrated circuit 110 in FIGS. 5A and 5B also have the M4 regions in the M4 layer. The M4 regions have the width $W_{M4}=35$ μm. The M4 layer is above the M3 layer. The width (35 μm) of the M4 regions is greater than the width (17 μm) of the M3 regions. The width (35 μm) of the M4 regions is about twice the width (17 μm) of the M3 regions.

In some embodiments, the plurality of metal regions of the exemplary integrated circuit for power conversion may further include a plurality of fourth metal regions in a fourth layer. The fourth layer is below the first layer and has a fourth width. A first portion of the fourth metal regions are coupled to the source regions of the power transistors. A second portion of the fourth metal regions are coupled to the drain regions of the power transistors. The fourth width is significantly less than the first width.

For example, the metal regions of integrated circuit 110 in FIGS. 5A and 5B also have the M1 regions in the M1 layer. The M1 layer is below the M2 layer and have the width $W_{M1}=0.5$ μm. The width (0.5 μm) of the M1 regions is substantially less than the width (8 μm) of the M2 regions. As shown in FIG. 5A, three of six M1 regions are coupled to the source regions of the power transistors. The other three of six M1 regions are coupled to the drain regions of the power transistors.

In some embodiments, the exemplary integrated circuit for power conversion may have M4, M3, and M2 regions in the layers M4, M3, and M2. The M3 regions may have a width that is 90% of a width of the M4 regions. The M2 regions may have a width that is 90% of the width of the M3 regions.

In some embodiments, the exemplary integrated circuit for power conversion may have M4, M3, and M2 regions in the layers M4, M3, and M2. The M3 regions may have a width that is 80% of a width of the M4 regions. The M2 regions may have a width that is 80% of the width of the M3 regions.

In some embodiments, the exemplary integrated circuit for power conversion may have M4, M3, and M2 regions in the layers M4, M3, and M2. The M3 regions may have a width that is 70% of a width of the M4 regions. The M2 regions may have a width that is 70% of the width of the M3 regions.

In some embodiments, the exemplary integrated circuit for power conversion may have M4, M3, and M2 regions in the layers M4, M3, and M2. The M3 regions may have a width that is 60% of a width of the M4 regions. The M2 regions may have a width that is 60% of the width of the M3 regions.

In some embodiments, the exemplary integrated circuit for power conversion may have M4, M3, and M2 regions in the layers M4, M3, and M2. The M3 regions may have a width that is 50% of a width of the M4 regions. The M2 regions may have a width that is 50% of the width of the M3 regions.

In some embodiments, the exemplary integrated circuit for power conversion may have M4, M3, and M2 regions in the layers M4, M3, and M2. The M3 regions may have a width that is 40% of a width of the M4 regions. The M2 regions may have a width that is 40% of the width of the M3 regions.

In some embodiments, the exemplary integrated circuit for power conversion may have M4, M3, and M2 regions in the layers M4, M3, and M2. The M3 regions may have a width that is 30% of a width of the M4 regions. The M2 regions may have a width that is 30% of the width of the M3 regions.

In some embodiments, the exemplary integrated circuit for power conversion may have M4, M3, and M2 regions in the layers M4, M3, and M2. The M3 regions may have a width that is 20% of a width of the M4 regions. The M2 regions may have a width that is 20% of the width of the M3 regions.

In some embodiments, the exemplary integrated circuit for power conversion may have M4, M3, and M2 regions in the layers M4, M3, and M2. The M3 regions may have a width that is 10% of a width of the M4 regions. The M2 regions may have a width that is 10% of the width of the M3 regions.

In some embodiments, the exemplary integrated circuit for power conversion may have M4, M3, and M2 regions in the layers M4, M3, and M2. The M3 regions may have a width between 90% and 10% of a width of the M4 regions. The M2 regions may have a width between 90% and 10% of the width of the M3 regions.

In some embodiments, an exemplary integrated circuit for power conversion may be mounted to a circuit board that has a plurality of conductive lines extending along a first direction perpendicular to a surface of the circuit board. The exemplary integrated circuit may include a plurality of metal regions. The plurality of metal regions of the exemplary integrated circuit may include a plurality of first metal regions extending along a second direction in a first layer of the exemplary integrated circuit. The plurality of metal regions of the exemplary integrated circuit may also include a plurality of second metal regions extending along a third direction in a second layer of the exemplary integrated circuit. The second layer is above the first layer. The third direction is perpendicular to the second direction.

For example, integrated circuit 110 is mounted to circuit board 120 in FIG. 2F or to circuit board 140 in FIG. 3A. Circuit board 120 (FIG. 2F) includes conductive lines 121*a*, 121*b*, 121*c*, and 121*d* extending along the Z-axis direction perpendicular to the surface of circuit board 120. Circuit board 140 (FIG. 3A) includes conductive lines 141*a*, 141*b*, 141*c*, and 141*d* extending along the Z-axis direction perpendicular to the surface of circuit board 140. Integrated circuit 110 (FIG. 2F or 3A) may include a plurality of M4, M3, M2, and M1 regions (FIG. 5A). That is, integrated circuit 110 may include M2 regions 201, 202, and 203 (FIG. 5A) extending along the X-axis direction in the M2 layer of integrated circuit 110. Integrated circuit 110 may also include the six M3 regions (FIG. 5A) extending along the Y-axis direction (FIG. 5B) in the M3 layer of integrated circuit 110. The M3 layer is above the M2 layer. The Y-axis direction is perpendicular to the X-axis direction.

In some embodiments, the exemplary integrated circuit for power conversion further includes a plurality of third metal regions extending along the second direction in a third layer. The third layer is above the second layer. For example, integrated circuit 110 (FIG. 5A) may also include M4 regions 401, 402, and 403 (FIG. 5A) extending along the X-axis direction in the M4 layer of integrated circuit 110. The M4 layer is above the M3 layer.

In some embodiments, the exemplary integrated circuit for power conversion may include a plurality of power transistors. The power transistors have a plurality of gate regions extending along the third direction. The exemplary integrated circuit may further include a plurality of fourth metal regions extending along the third direction in a fourth layer. The fourth layer is above the third layer. The fourth metal regions extend along the same third direction as the gate regions. For example, integrated circuit 110 (FIG. 5A) may include a plurality of power transistors. The power transistors include a plurality of gate regions, such as gate regions G2 and G3 in FIG. 5A. Gate regions G2 and G3 may extend along the Y-axis direction. Integrated circuit 110 (FIG. 5A) may further include a plurality of RDL regions (FIGS. 5A and 6A) extending along the Y-axis direction in RDL layer. The RDL layer is above the M4 layer. The RDL metal regions extend along the same Y-axis direction as the gate regions.

Figure 6A:
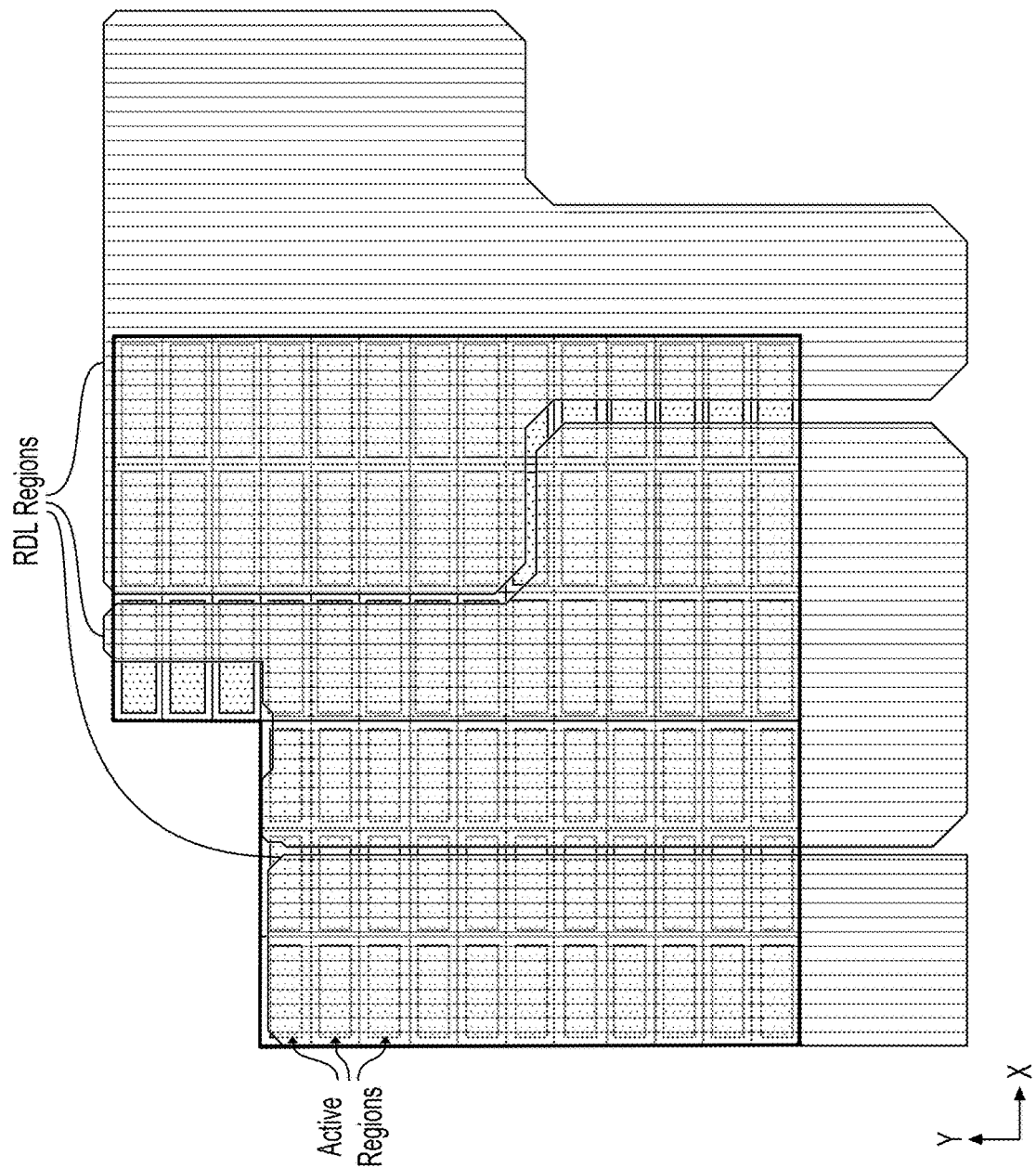
FIG. 6A is a top view of redistribution layer (RDL) regions and active regions of the exemplary integrated circuit for power conversion, in accordance with some embodiments.

FIG. 6A is a top view of RDL regions and active regions of integrated circuit 110 for power conversion, in accordance with some embodiments. As shown in FIG. 6A, integrated circuit 110 may include three RDL regions in the RDL layer and a plurality of active regions in the AR layer. The three RDL regions may extend along the Y-axis direction. The three RDL regions may be formed above all of the active regions and may be configured to redistribute vertical currents from any of the active regions (i.e., any of the power transistors) to proper output terminals of integrated circuit 110.

Figure 6B:
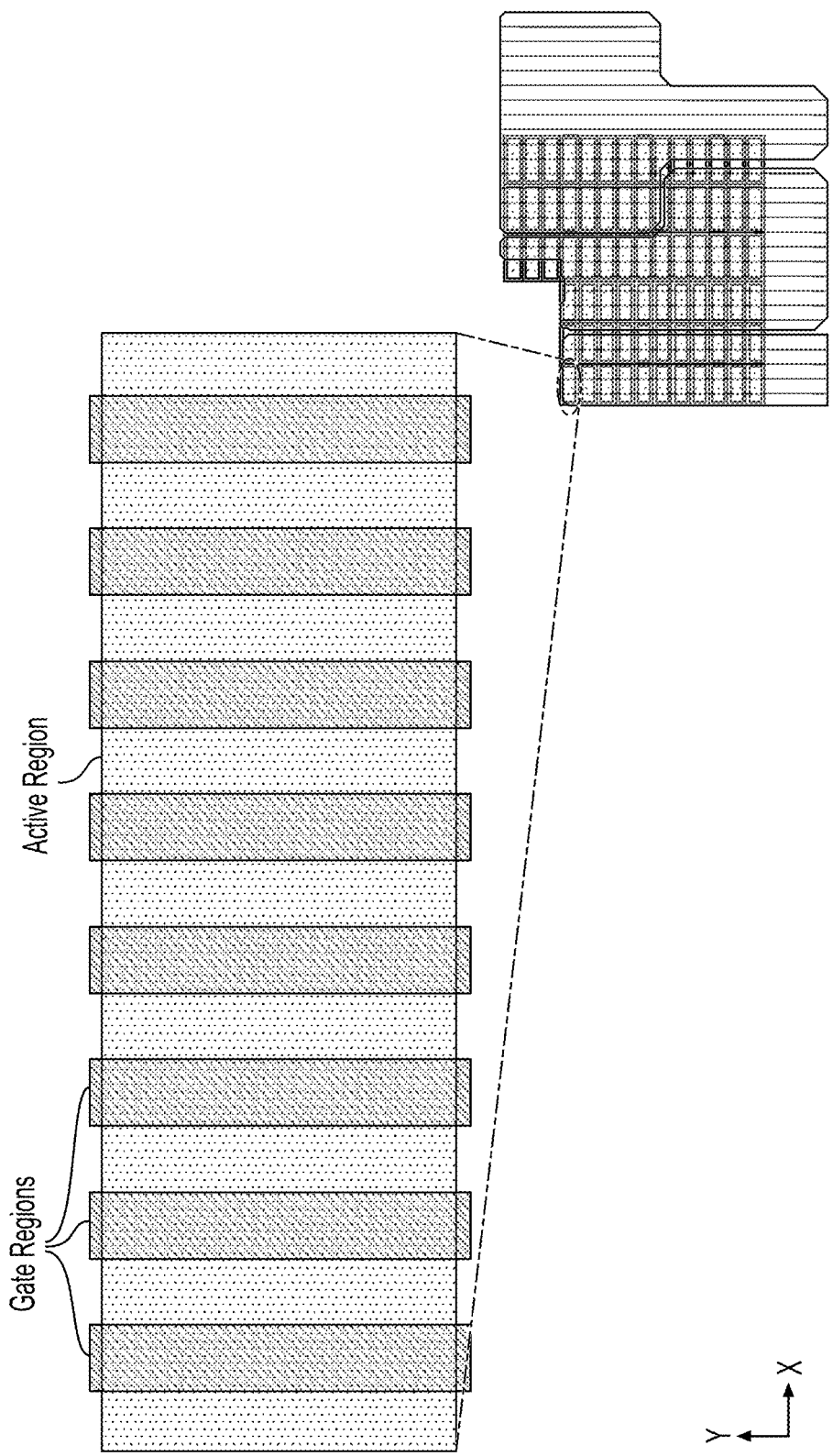
FIG. 6B is a top view of an RDL region, gate regions, and an active region of the exemplary integrated circuit for power conversion, in accordance with some embodiments.

FIG. 6B is a top view of a part of an RDL region and gate regions over an active region of integrated circuit 100 in FIG. 6A, in accordance with some embodiments. As shown in FIGS. 6A and 6B, the RDL region of integrated circuit 110 may extend along the Y-axis (FIG. 6A). Integrated circuit 110 may include a plurality of gate regions above the active region. The gate regions may extend along the Y-axis region. That is, the RDL region and the gate regions may extend along the same Y-axis direction in integrated circuit 110.

In some embodiments, an exemplary integrated circuit for power conversion includes a plurality of RDL regions extending along the same direction as a plurality of gate regions over a plurality of active regions in the exemplary integrated circuit. For example, as shown in FIG. 6A, the three RDL regions of integrated circuit 110 may extend along the Y-axis direction. Integrated circuit 110 may also include a plurality of gate regions above each of the active regions, similar to the gate regions over the active region shown in FIG. 6B. The gate regions above each of the active regions may also extend along the Y-axis direction. Thus, integrated circuit 110 may include three RDL regions extending along the same Y-axis direction as the plurality of gate regions over the active regions.

Figure 7A:
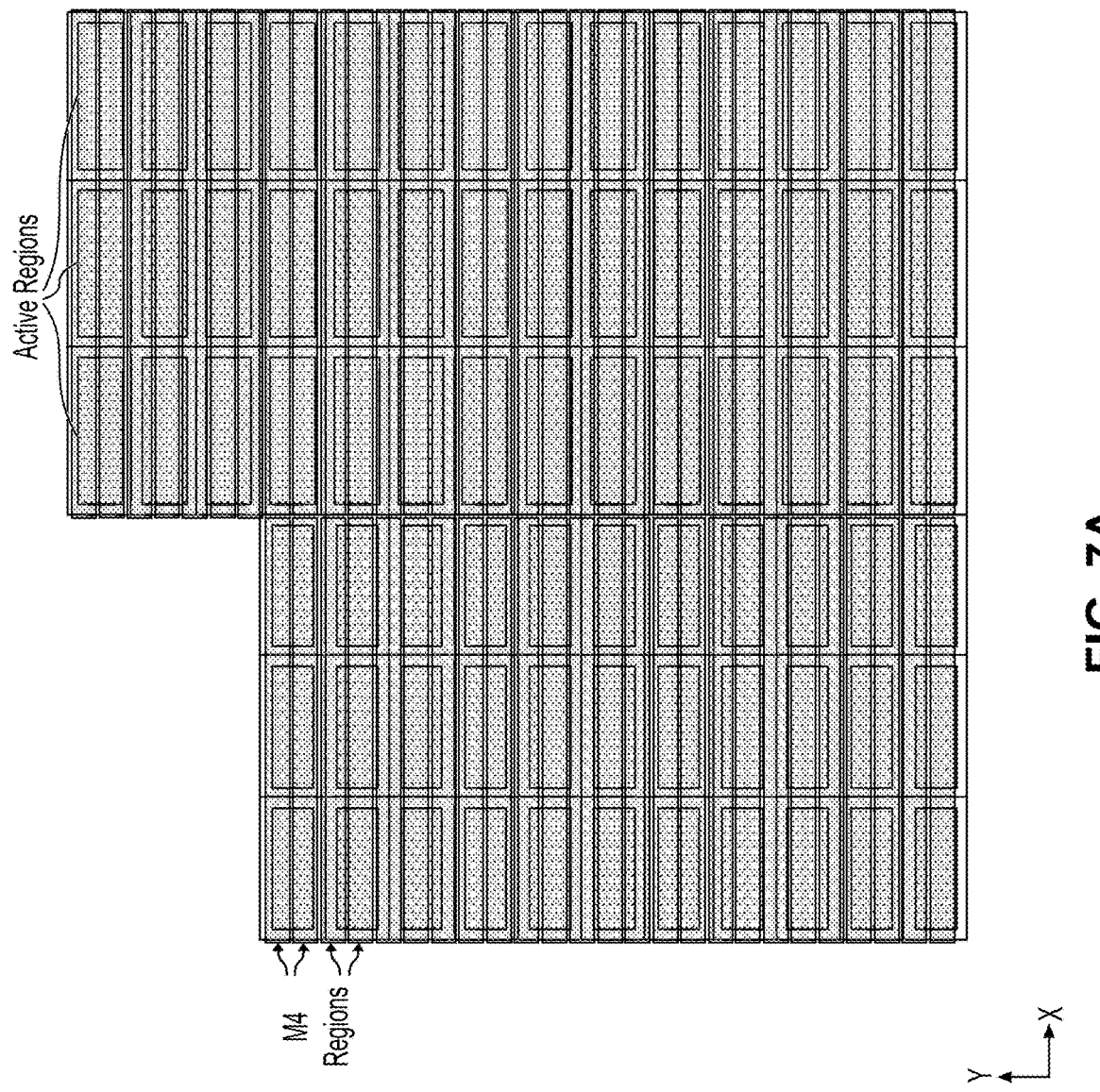
FIG. 7A is a top view of metal 4 (M4) regions and active regions of the exemplary integrated circuit for power conversion, in accordance with some embodiments.

FIG. 7A is a top view of M4 regions and active regions of integrated circuit 110 for power conversion, in accordance with some embodiments. As shown in FIG. 7A, integrated circuit 110 may include a plurality of M4 regions and the plurality of active regions. The M4 regions may extend along the X-axis direction. As shown in FIG. 7A, the plurality of M4 regions of integrated circuit 110 may be formed above all of the active regions and may be configured to receive vertical currents from all of the active regions (i.e., any of the power transistors) or to transmit vertical currents to any of the active regions.

Figure 7B:
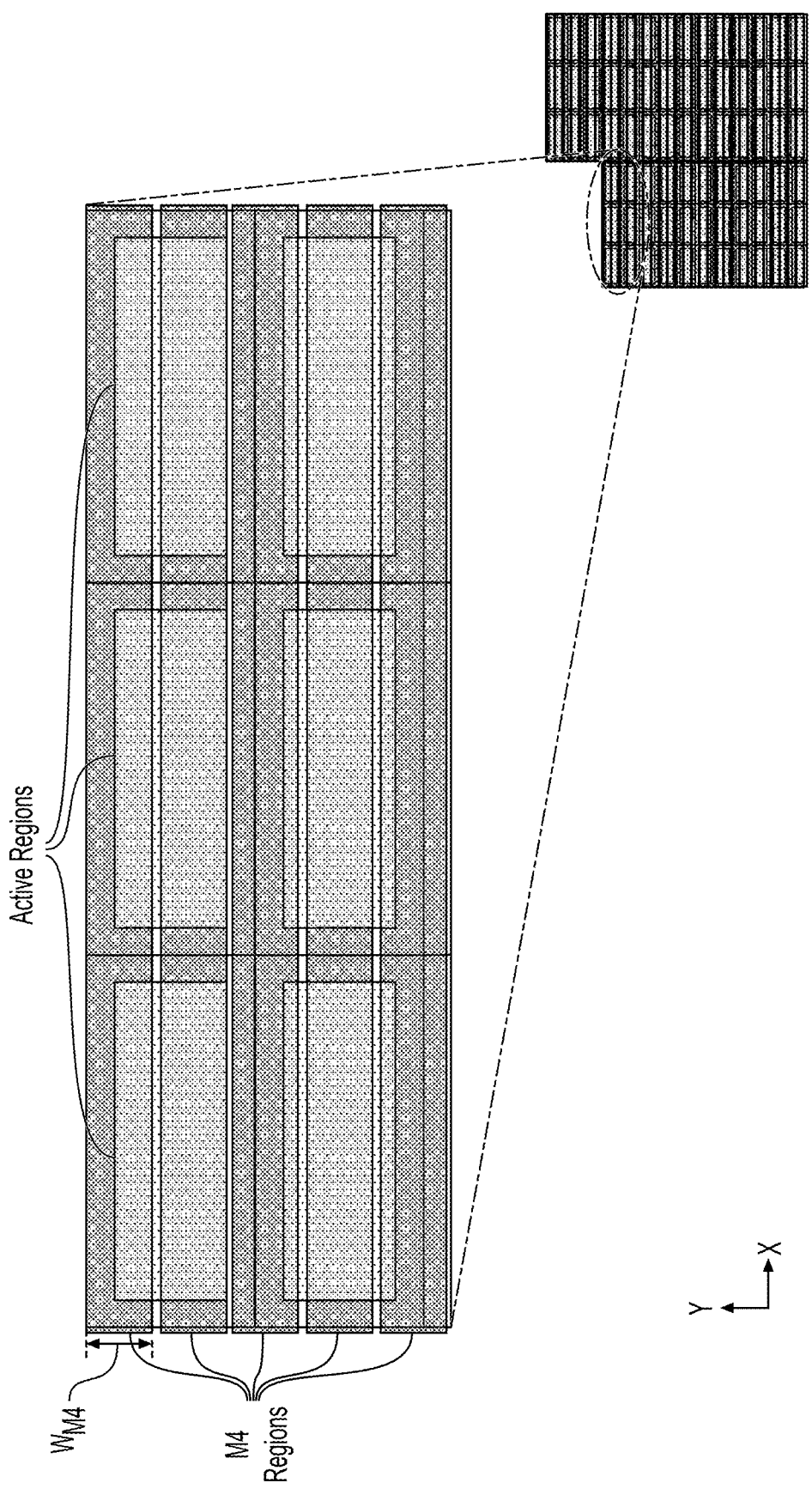
FIG. 7B is a top view of four M4 regions and six active regions of the exemplary integrated circuit for power conversion, in accordance with some embodiments.

FIG. 7B is a top view of four M4 regions and six active regions of the exemplary integrated circuit for power conversion, in accordance with some embodiments. As shown in FIG. 7B, the four M4 regions may be formed above the six active regions. The M4 regions may have the width $W_{M4}$. As an example, the width $W_{M4}$ may be 35 µm, i.e., $W_{M4}=35$ µm. In some embodiments, the M4 regions of integrated circuit 110 may be any size feasible for a technology node if they are wider and/or thicker than M3, M2, and M1 regions below the M4 regions. In some embodiments, the M4 regions of integrated circuit 110 may be any size feasible for a technology node if they have lower resistances than M3, M2, and M1 regions below the M4 regions.

Figure 7C:
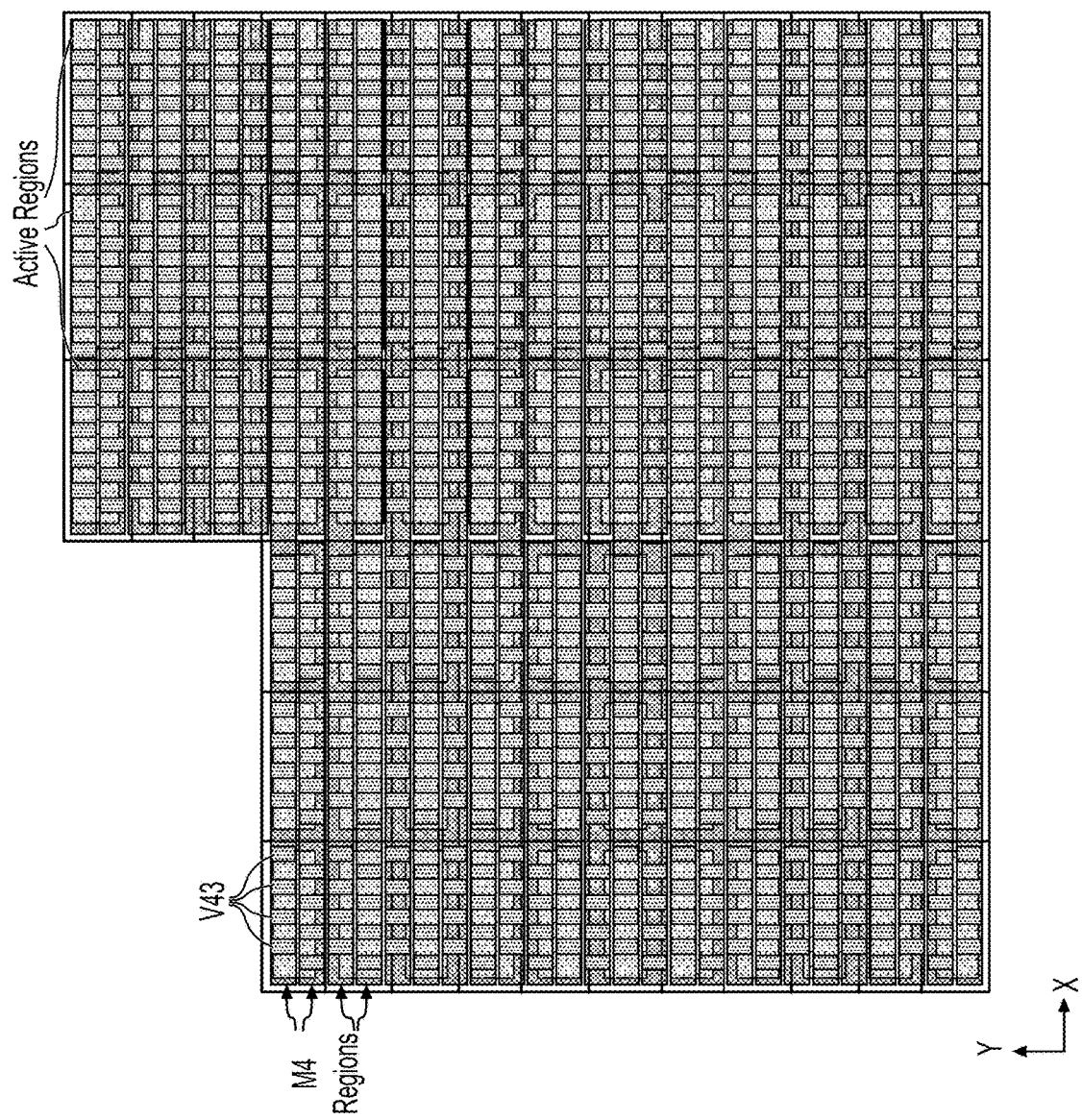
FIG. 7C is a top view of M4 regions, vias between metal layers 4 and 3 (V43 vias) and active regions of the exemplary integrated circuit for power conversion, in accordance with some embodiments.

FIG. 7C is a top view of M4 regions, V43 vias between M4 and M3 layers and active regions of integrated circuit 110 for power conversion, in accordance with some embodiments. As shown in FIG. 7C, integrated circuit 110 may include V43 vias formed with balanced distribution over the plurality of active regions (i.e., the power transistors) of integrated circuit 110.

Figure 7D:
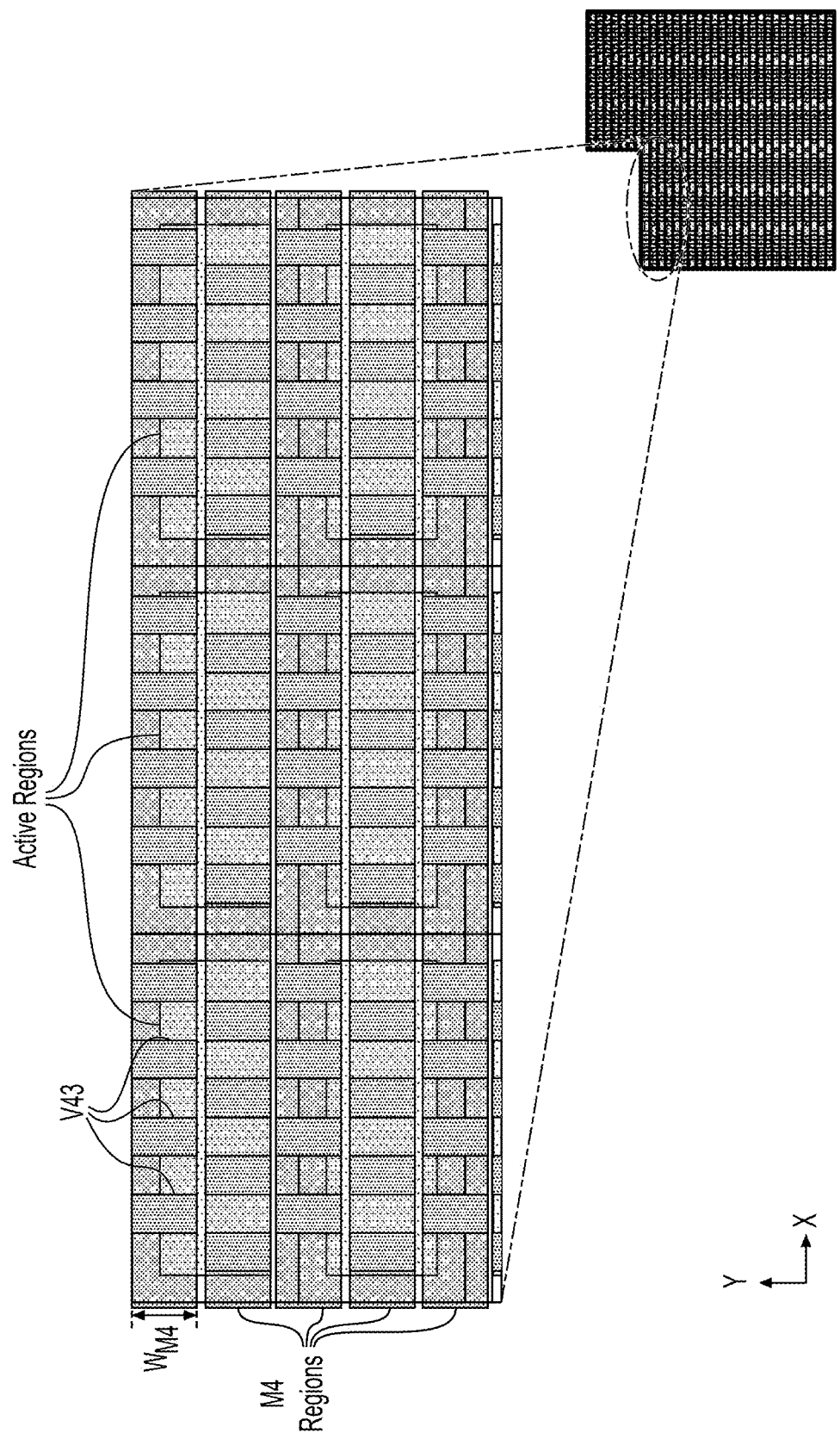
FIG. 7D is a top view of five M4 regions, V43 vias, and six active regions of the exemplary integrated circuit for power conversion, in accordance with some embodiments.

FIG. 7D is a top view of five M4 regions, V43 vias, and six active regions of integrated circuit 110 for power conversion, in accordance with some embodiments. As shown in FIG. 7D, sixty V43 vias may be formed with balanced distribution under five M4 regions and over six active regions (i.e., the power transistors) of integrated circuit 110.

Figure 8A:
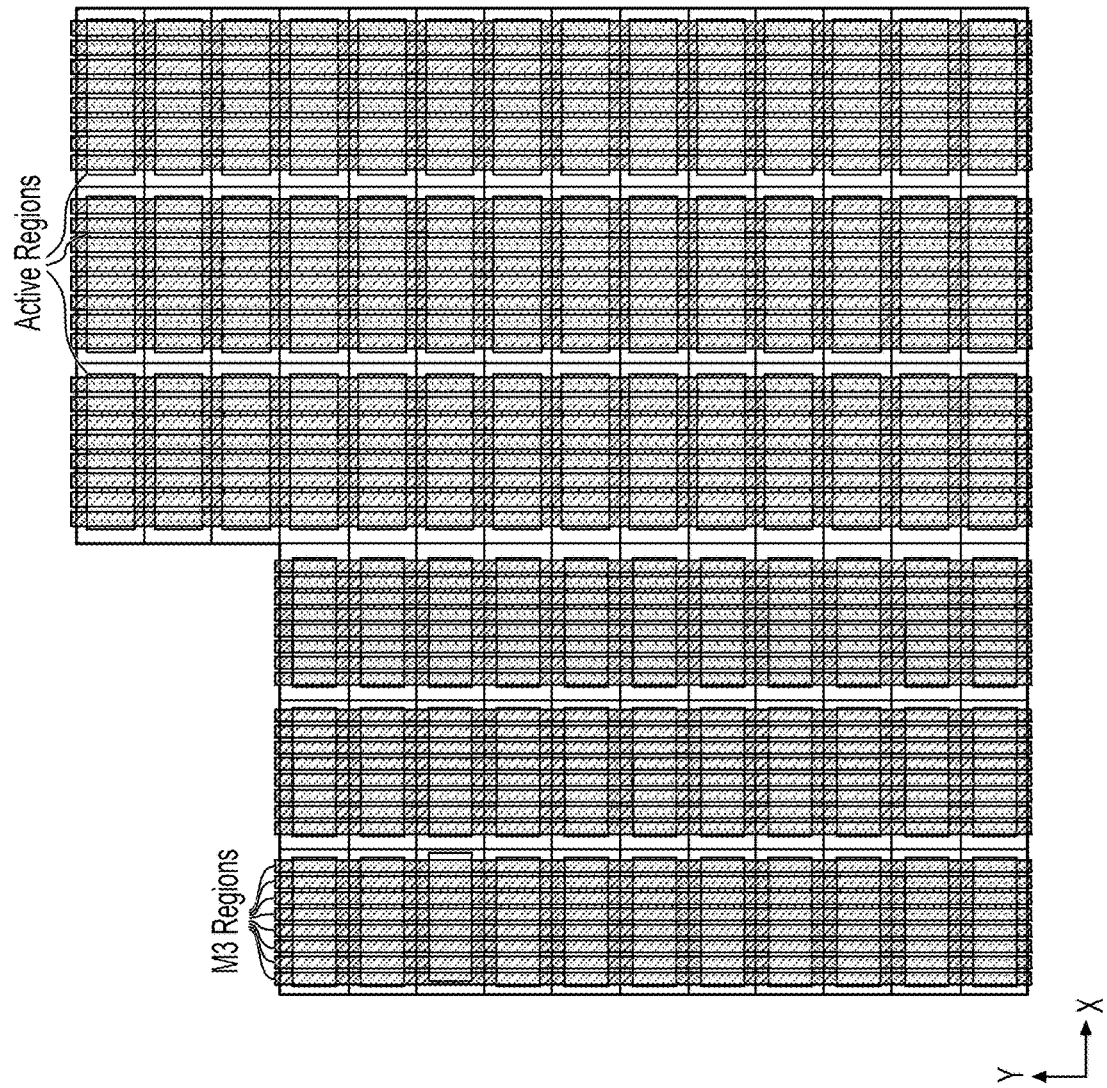
FIG. 8A is a top view of metal 3 (M3) regions and active regions of the exemplary integrated circuit for power conversion, in accordance with some embodiments.

FIG. 8A is a top view of M3 regions and active regions of integrated circuit 110 for power conversion, in accordance with some embodiments. As shown in FIG. 8A, integrated circuit 110 may include a plurality of M3 regions and the plurality of active regions. The M3 regions may extend along the Y-axis direction. As shown in FIG. 8A, the plurality of M3 regions of integrated circuit 110 may be formed above all of the active regions and may be configured to receive vertical currents from all of the active regions (i.e., any of the power transistors) or to transmit vertical currents to any of the active regions.

Figure 8B:
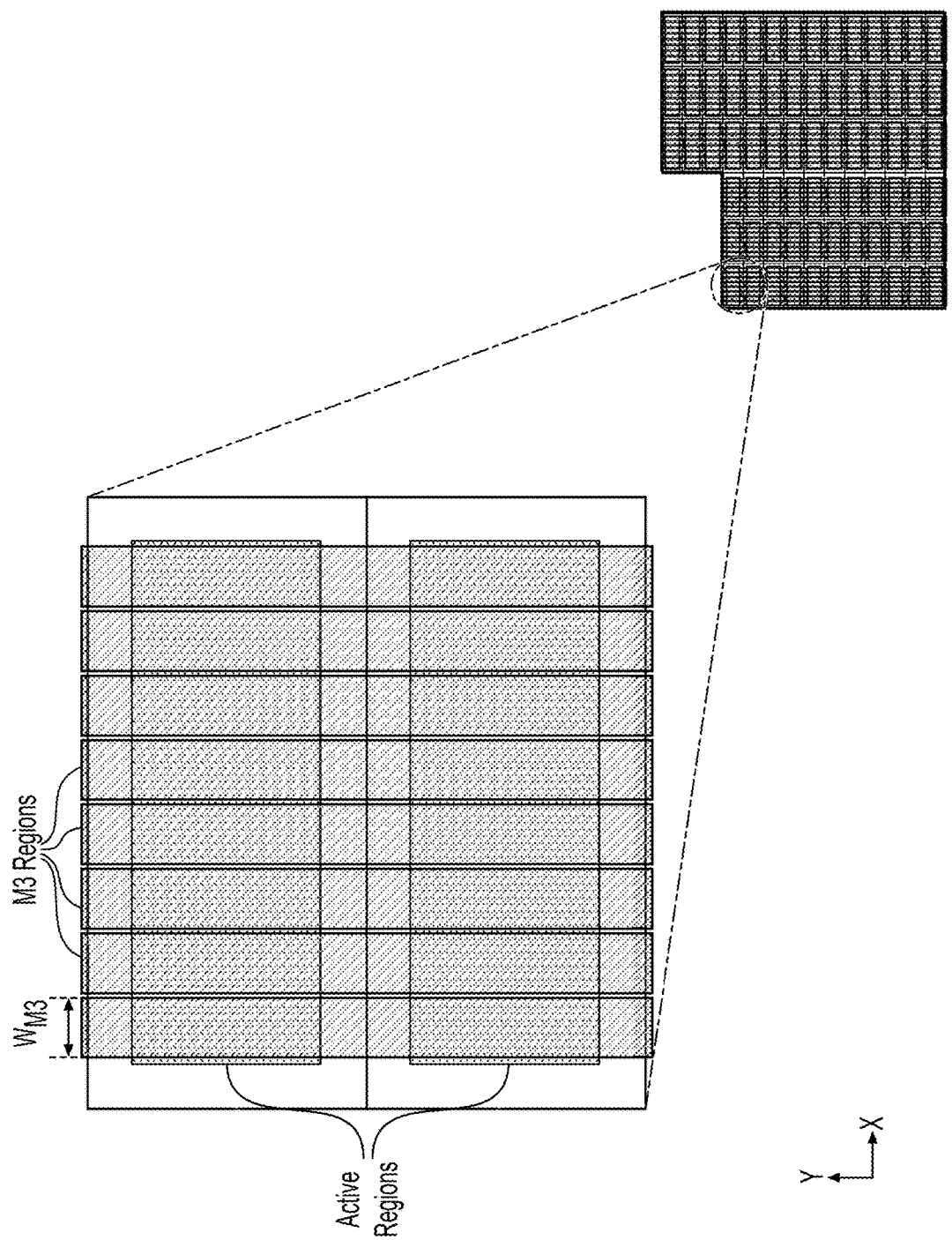
FIG. 8B is a top view of eight M3 regions and two active regions of the exemplary integrated circuit for power conversion, in accordance with some embodiments.

FIG. 8B is a top view of eight M3 regions and two active regions of integrated circuit 110 for power conversion, in accordance with some embodiments. As shown in FIG. 8B, the eight M3 regions may be formed above the two active regions. The M3 regions may have the width $W_{M3}$. As an example, the width $W_{M4}$ may be 17 µm, i.e., $W_{M3}=17$ µm.

Figure 8C:
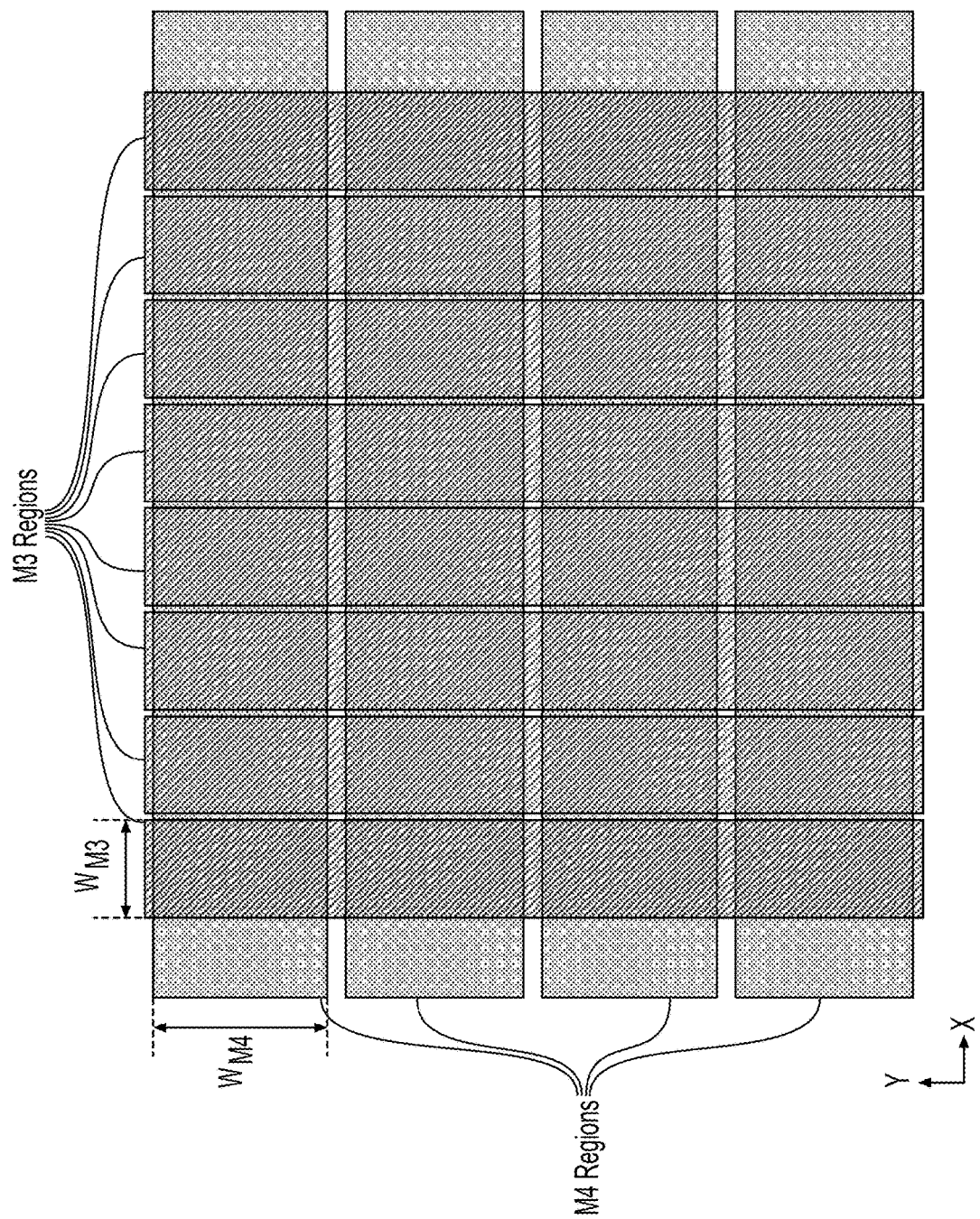
FIG. 8C is a top view of four M4 regions and eight M3 regions of the exemplary integrated circuit for power conversion, in accordance with some embodiments.

FIG. 8C is a top view of four M4 regions and eight M3 regions of integrated circuit 100 for power conversion, in accordance with some embodiments. As shown in FIG. 8C, the four M4 regions may extend along the X-axis direction. The eight M3 regions may extend along the Y-axis direction. That is, the M3 regions may extend along a direction perpendicular to a direction along which the M4 region may extend. As shown in FIG. 8C, the M4 regions may have the width $W_{M4}$. As an example, the width $W_{M4}$ may be 35 µm, i.e., $W_{M4}=35$ µm. The M3 regions may have the width $W_{M3}$. The width $W_{M4}$ may be 17 µm, i.e., $W_{M3}=17$ µm. The M3 regions may have the width that is about 50% of the width of the M4 regions. The width of the M4 regions may be about twice the width of the M3 regions, i.e., $W_{M4}=2\times W_{M3}$.

In some embodiments, the M3 regions of integrated circuit 110 may have any size feasible for a technology node as long as it is thinner and/or less thick than those M4 regions above the M3 regions, and wider and/or thicker than those M2 and M1 regions (FIG. 5A or 5B) below the M3 regions. In some embodiments, the M3 regions of integrated circuit 110 may have any size feasible for a technology node as long as they have higher resistances than those M4 regions above the M3 regions, and lower resistances than those M2 and M1 regions (FIG. 5A or 5B) below the M3 regions.

Figure 8D:
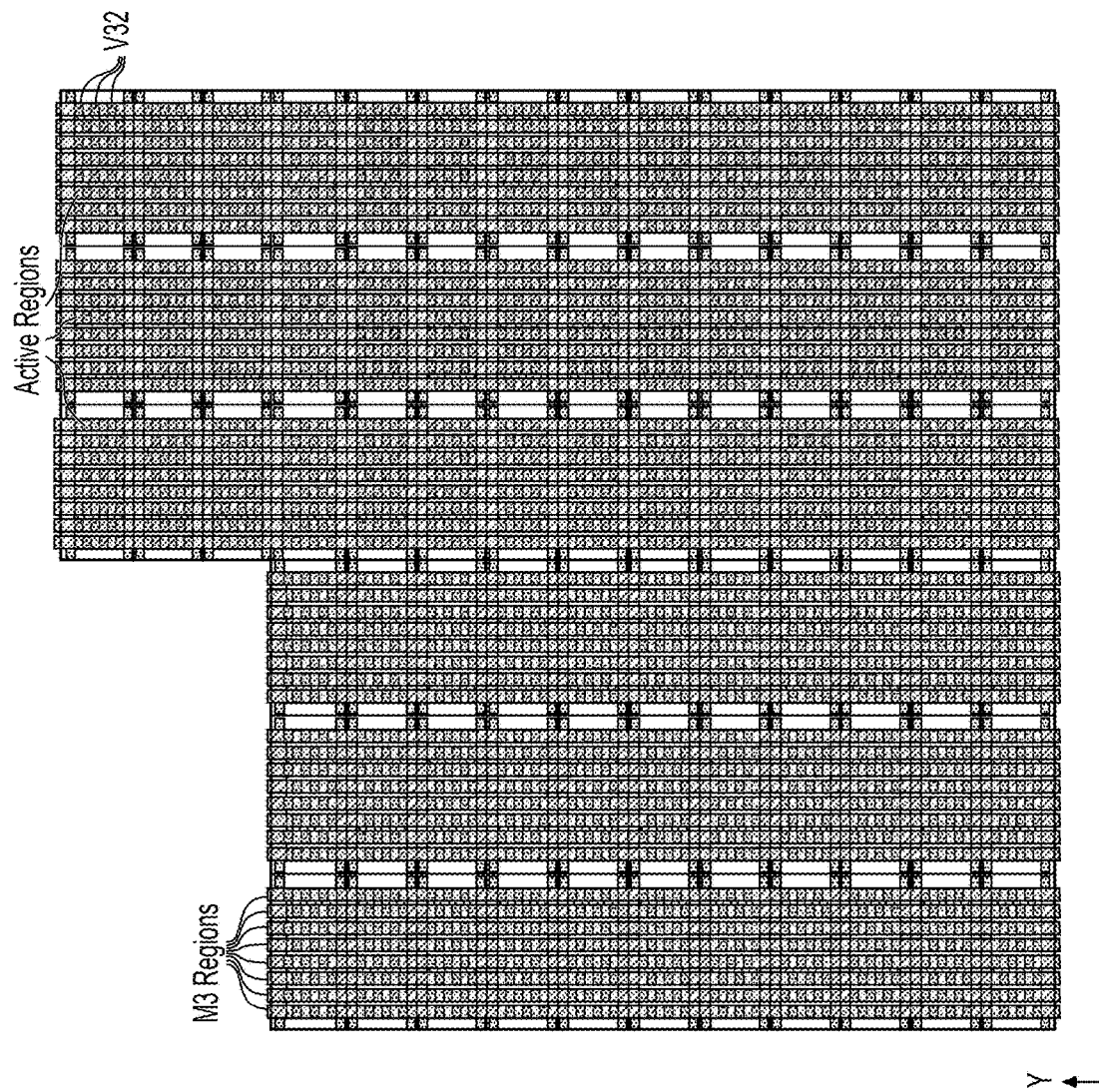
FIG. 8D is a top view of vias between metal layers 3 and 2 (V32 vias) and active regions of the exemplary integrated circuit for power conversion, in accordance with some embodiments.

FIG. 8D is a top view of V32 vias between M3 and M2 layers and active regions of integrated circuit 110 for power conversion, in accordance with some embodiments. As shown in FIG. 8D, integrated circuit 110 may include V32 vias formed with balanced distribution over the plurality of active regions (i.e., the power transistors) of integrated circuit 110.

Figure 8E:
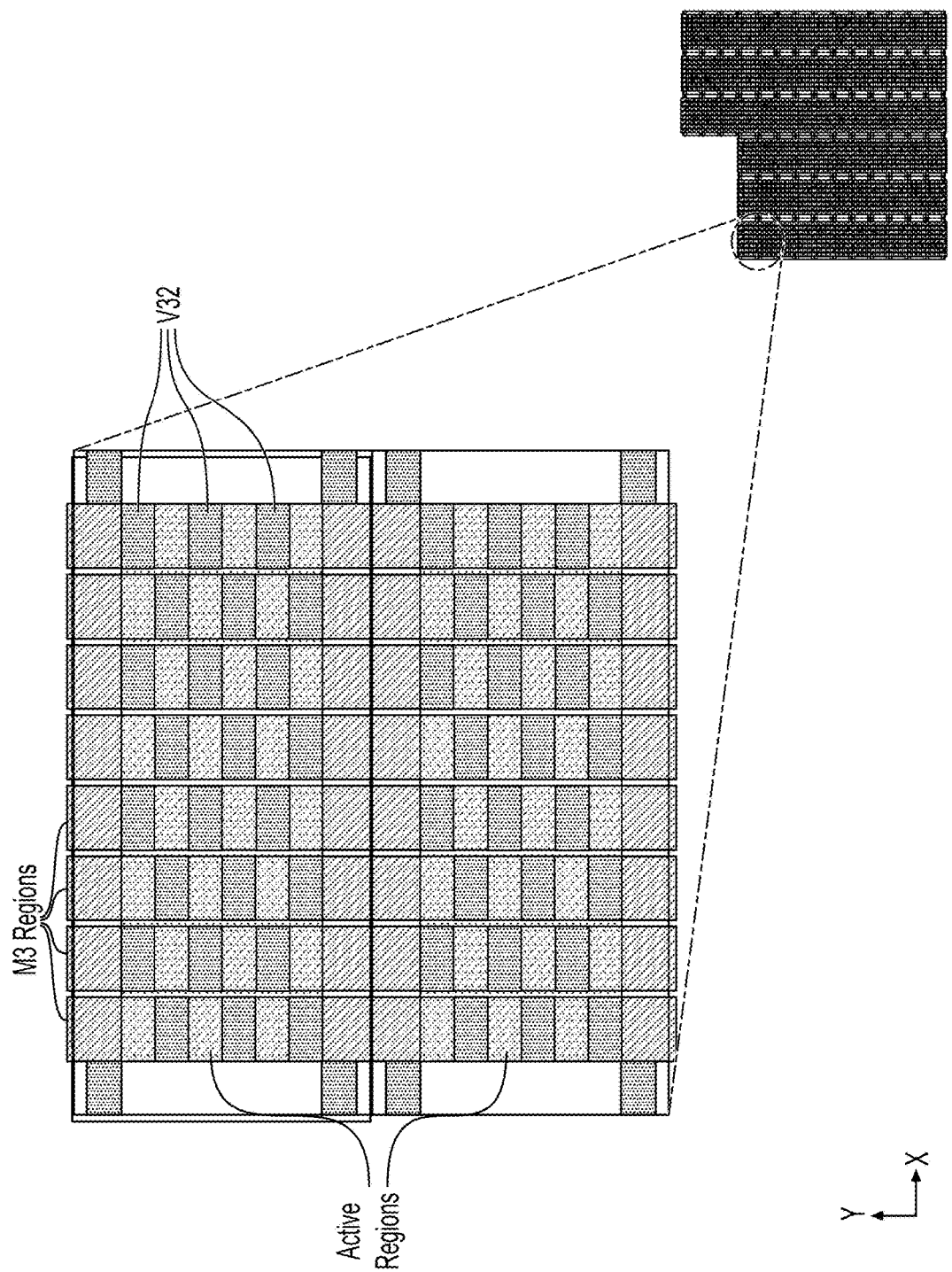
FIG. 8E is a top view of eight M3 regions, V32 vias, and two active regions of the exemplary integrated circuit for power conversion, in accordance with some embodiments.

FIG. 8E is a top view of eight M3 regions, V32 vias, and two active regions of the exemplary integrated circuit for power conversion, in accordance with some embodiments. As shown in FIG. 8E, twenty-four V32 vias may be formed with balanced distribution under eight M3 regions over each active region (i.e., the power transistors) of integrated circuit 110. Four additional V32 vias may be formed at the four corners of the active region.

In some embodiments, the exemplary integrated circuit for power conversion also includes a plurality of first vias coupled between the first metal regions and the second metal regions and a plurality of second vias coupled between the second metal regions and the third metal regions. The first vias have balanced distribution over the power transistors. The second vias have balanced distribution over the power transistors.

For example, as shown in FIGS. 7C and 7D, integrated circuit 110 may include the plurality of V43 vias coupled between the M4 regions and the M3 regions (FIG. 5A). The plurality of V43 vias may have balanced distribution over the plurality of active regions (i.e., the power transistors) of integrated circuit 110. As shown in FIGS. 8D and 8E, integrated circuit 110 may also include the plurality of V32 vias coupled between the M3 regions and the M2 regions (FIG. 5A). The plurality of V32 vias may have balanced distribution over the plurality of active regions (i.e., the power transistors) of integrated circuit 110.

Figure 9A:
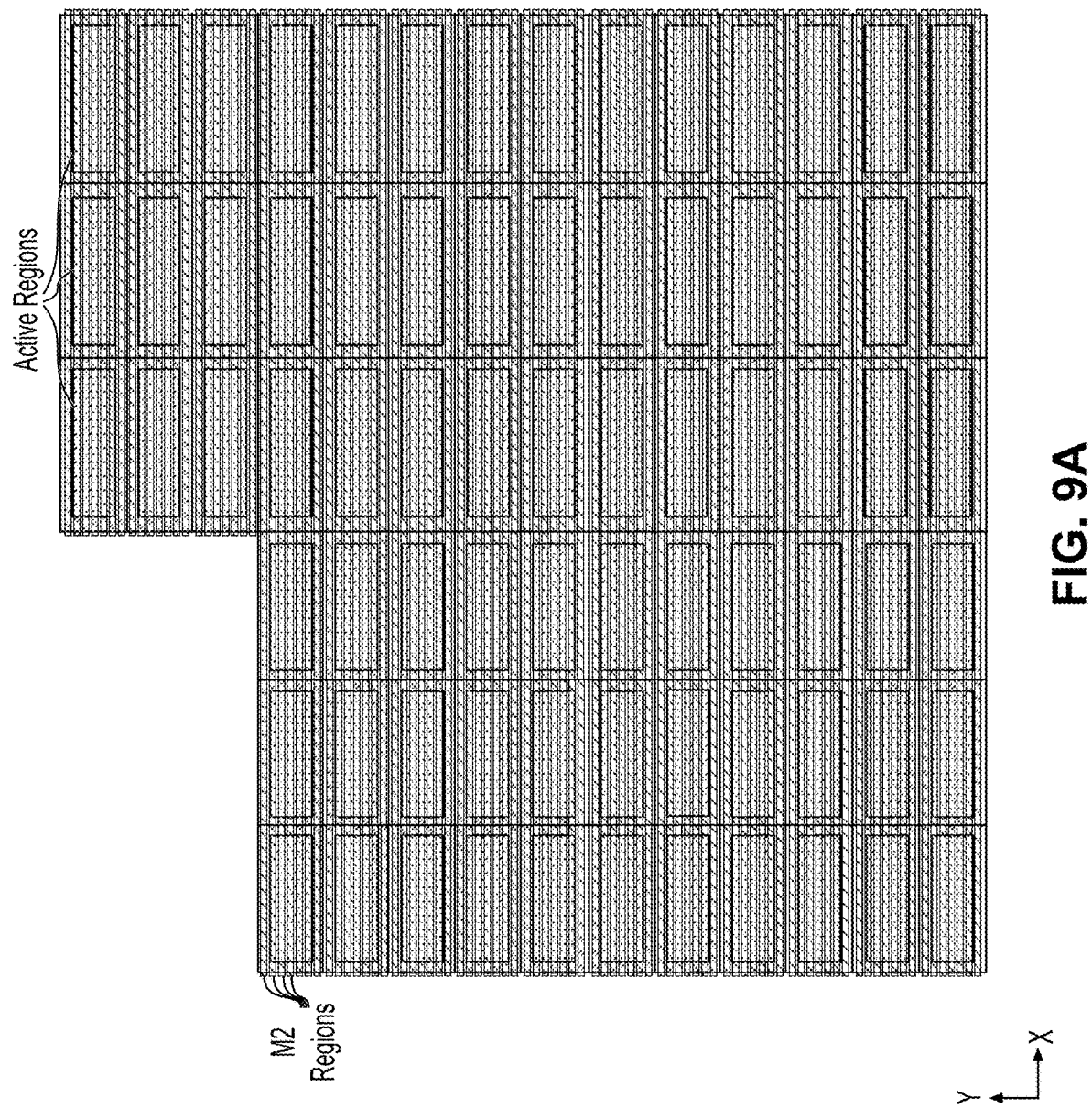
FIG. 9A is a top view of metal 2 (M2) regions and active regions of the exemplary integrated circuit for power conversion, in accordance with some embodiments.

FIG. 9A is a top view of M2 regions and active regions of integrated circuit 110 for power conversion, in accordance with some embodiments.

As shown in FIG. 9A, integrated circuit 110 may include a plurality of M2 regions and the plurality of active regions. The M2 regions may extend along the X-axis direction. As shown in FIG. 9A, the plurality of M2 regions of integrated circuit 110 may be formed above all of the active regions and may be configured to receive vertical currents from all of the active regions (i.e., any of the power transistors) or to transmit vertical currents to any of the active regions.

Figure 9B:
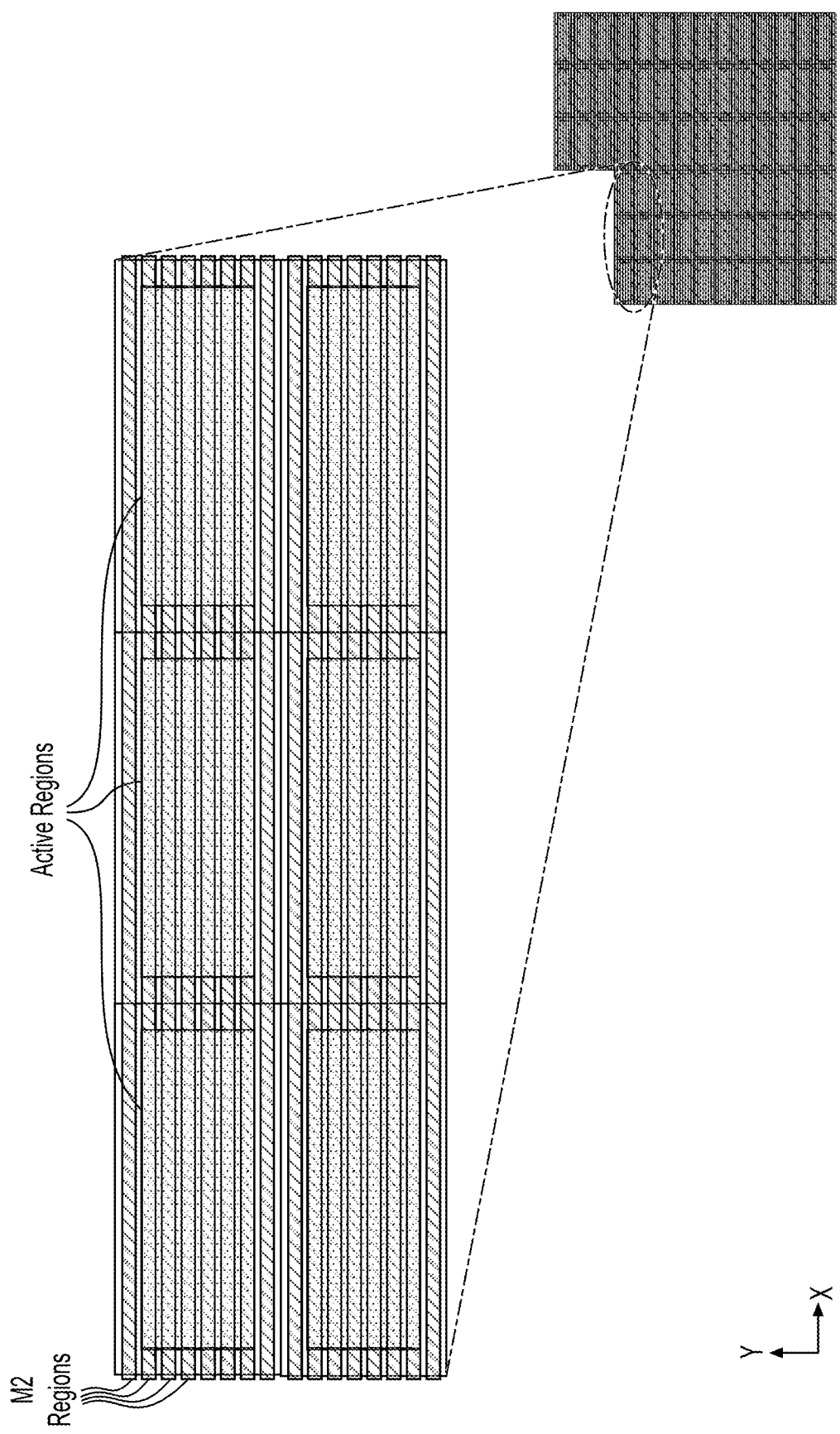
FIG. 9B is a top view of M2 regions and six active regions of the exemplary integrated circuit for power conversion, in accordance with some embodiments.

FIG. 9B is a top view of sixteen M2 regions and six active regions of integrated circuit 110 for power conversion, in accordance with some embodiments. As shown in FIG. 9B, M2 regions may be formed above the six active regions. The M2 regions may have the width $W_{M2}$. As an example, the width $W_{M2}$ may be 8 µm, i.e., $W_{M2}=8$ µm. In some embodiments, the M2 regions of integrated circuit 110 may be any size feasible for a technology node as long as they are wider and/or thicker than those M1 regions below the M2 regions. In some embodiments, the M2 regions of integrated circuit 110 may be any size feasible for a technology node as long as they have greater resistances than those M4 and M3 above the M2 regions.

Figure 9C:
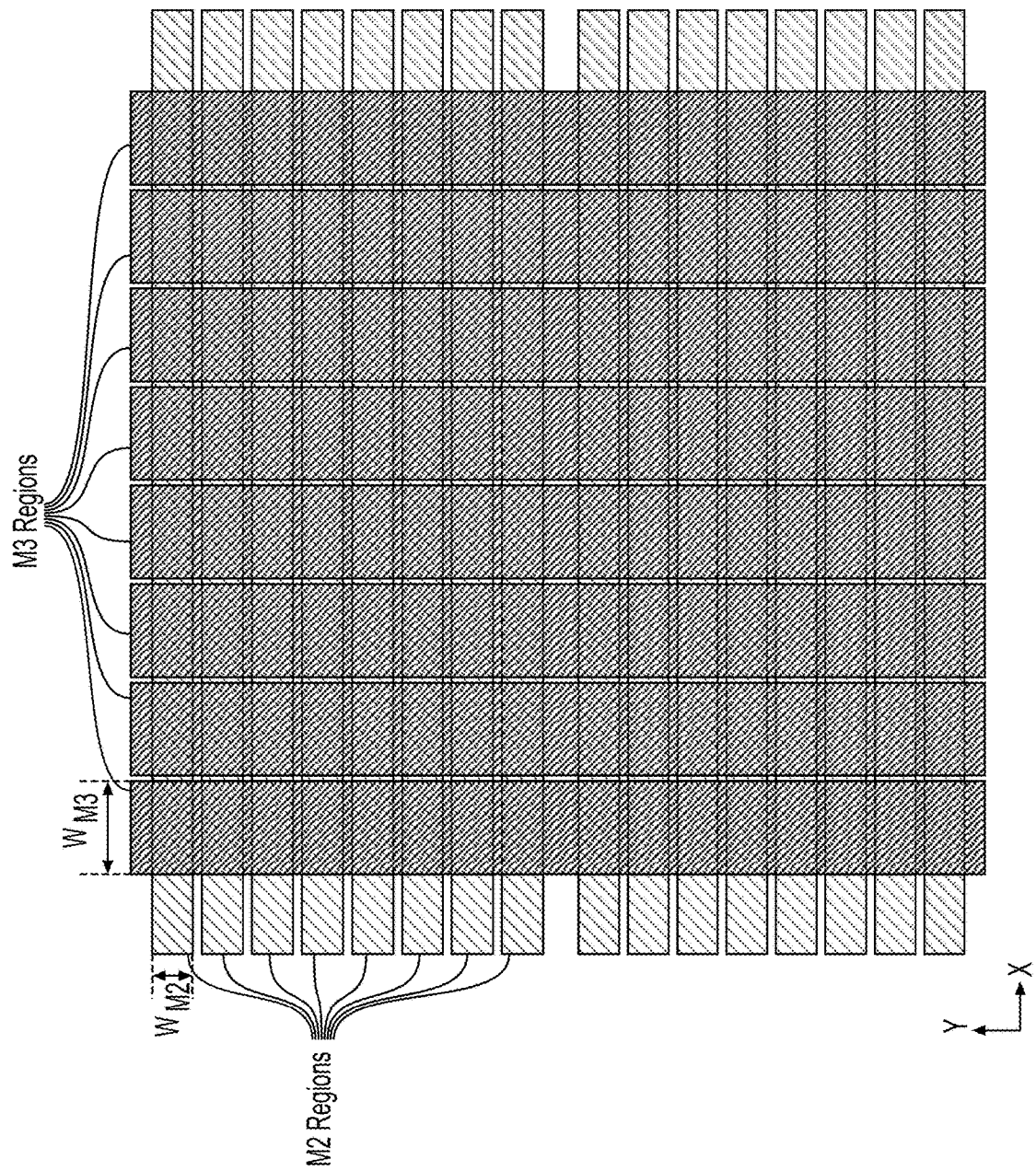
FIG. 9C is a top view of M3 regions and M2 regions of the exemplary integrated circuit for power conversion, in accordance with some embodiments.

FIG. 9C is a top view of M3 regions and M2 regions of the exemplary integrated circuit for power conversion, in accordance with some embodiments.

As shown in FIG. 9C, the eight M3 regions may extend along the Y-axis direction. The sixteen M2 regions may extend along the X-axis direction. That is, the M2 regions may extend along a direction perpendicular to a direction along which the M3 region may extend. As shown in FIG. 9C, the M3 regions may have the width $W_{M3}$. The width $W_{M4}$ may be, for example, 17 μm, i.e., $W_{M3}$=17 μm. The M2 regions may have the width $W_{M2}$. The width $W_{M2}$ may be 8 μm, i.e., $W_{M2}$=8 μm. The M2 regions may have the width that is about 50% of the width of the M3 regions. The width of the M3 regions may be about twice the width of the M2 regions, i.e., $W_{M3}$=2×$W_{M2}$.

In some embodiments, the M2 regions of integrated circuit 110 may have any size feasible for a technology node as long as it is thinner and/or less thick than those M3 regions above the M2 regions, and wider and/or thicker than those M1 regions (FIG. 5A or 5B) below the M2 regions. In some embodiments, the M2 regions of integrated circuit 110 may have any size feasible for a technology node as long as they have higher resistances than those M4 and M3 regions above the M2 regions.

Figure 10A:
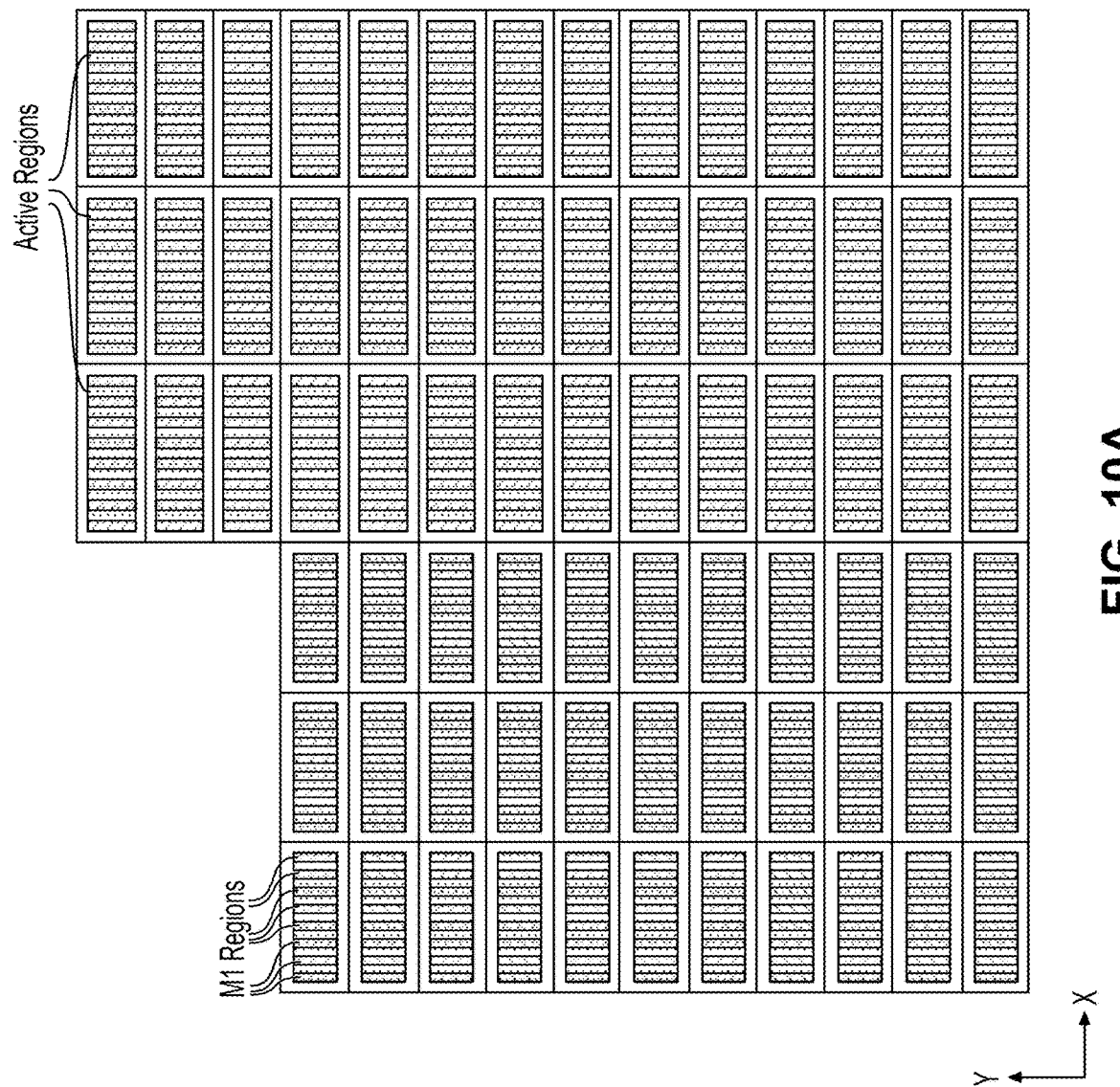
FIG. 10A is a top view of metal 1 (M1) regions and active regions of the exemplary integrated circuit for power conversion, in accordance with some embodiments.

FIG. 10A is a top view of M1 regions and active regions of integrated circuit 110 for power conversion, in accordance with some embodiments. As shown in FIG. 10A, integrated circuit 110 may include a plurality of M1 regions and the plurality of active regions. The M1 regions may extend along the Y-axis direction. As shown in FIG. 10A, the plurality of M1 regions of integrated circuit 110 may be formed above all of the active regions and may be configured to receive vertical currents from source regions and drain regions of the power transistors in the active regions, or to transmit vertical currents to the source regions and drain regions of the power transistors.

Figure 10B:
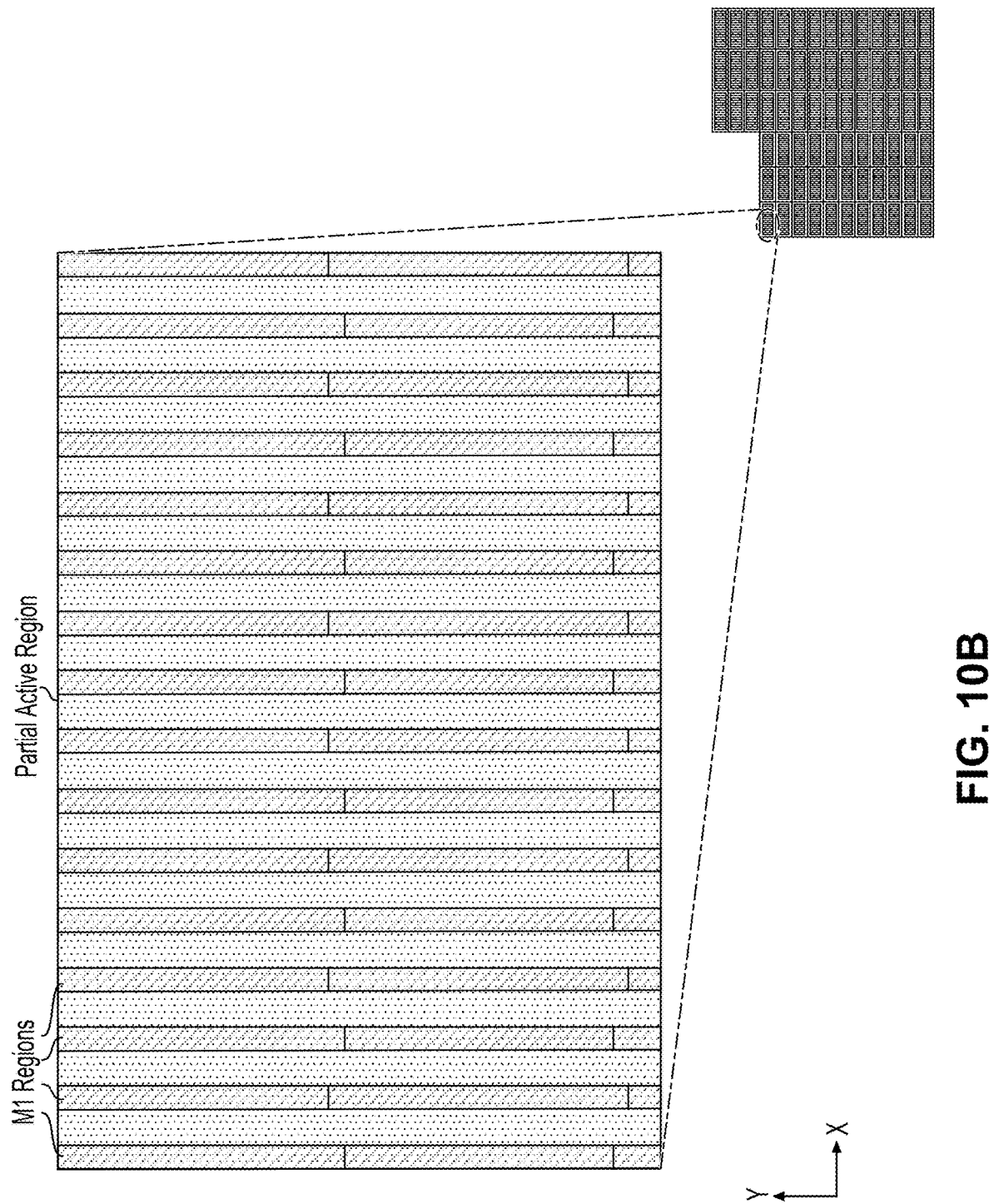
FIG. 10B is a top view of M1 regions and an active region of the exemplary integrated circuit for power conversion, in accordance with some embodiments.

FIG. 10B is a top view of M1 regions and an active region of integrated circuit 110 for power conversion, in accordance with some embodiments. As shown in FIG. 10B, integrated circuit 110 may include a plurality of M1 regions formed above each active region. The M1 regions may have the width $W_{M1}$. The width $W_{M1}$ may be, for example, 0.5 μm, i.e., $W_{M1}$=0.5 μm. The M2 regions above the M1 regions may have the width $W_{M2}$. The width $W_{M2}$ may be 8 μm, i.e., $W_{M2}$=8 μm. The width of the M1 regions may be 6.25% of the width of the M2 regions, i.e., $W_{M1}$=0.0625×$W_{M2}$. The width of the M1 regions is significantly less than the width of those M2 regions above the M1 regions.

In some embodiments, the width of the M1 regions may be 5 to 20% of the width of the M2 regions. The width of the M1 regions is considered to be significantly less than the width of those M2 regions above the M1 regions.

Figure 10C:
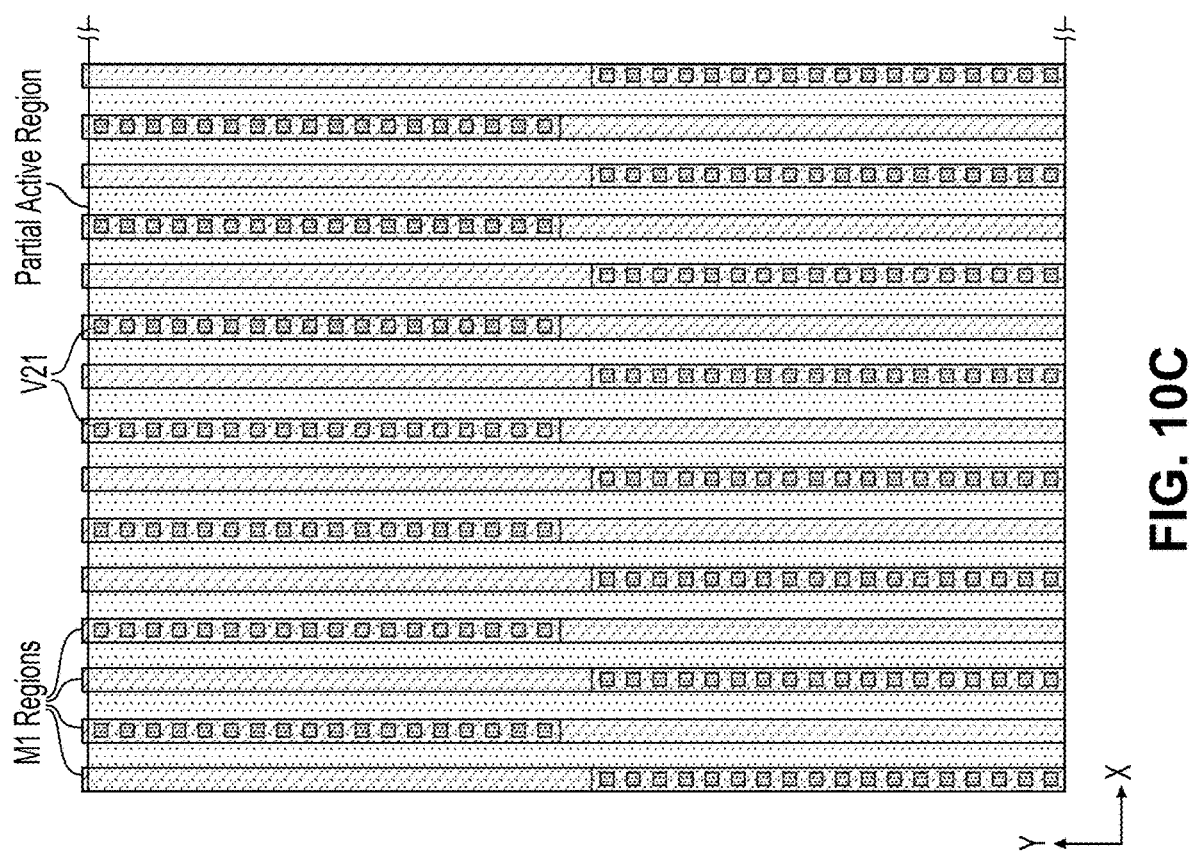
FIG. 10C is a top view of M1 regions, vias between metal layer 2 and 1 (V21 vias), and a partial active region of the exemplary integrated circuit for power conversion, in accordance with some embodiments.

FIG. 10C is a top view of M1 regions, V21 vias between M2 and M1 layers, and a partial active region of integrated circuit 110 for power conversion, in accordance with some embodiments. As shown in FIG. 10C, integrated circuit 110 may include V21 vias formed with balanced distribution over the partial active region (i.e., the power transistors) of integrated circuit 110. Although only the partial active region is shown in FIG. 10C, the other part of the active region is the same as shown. That is, integrated circuit 110 may include V21 vias formed with balanced distribution over the active region (i.e., the power transistors) of integrated circuit 110. Integrated circuit 110 may include V21 vias formed with balanced distribution over all of the plurality of active regions of integrated circuit 110.

Figure 11:
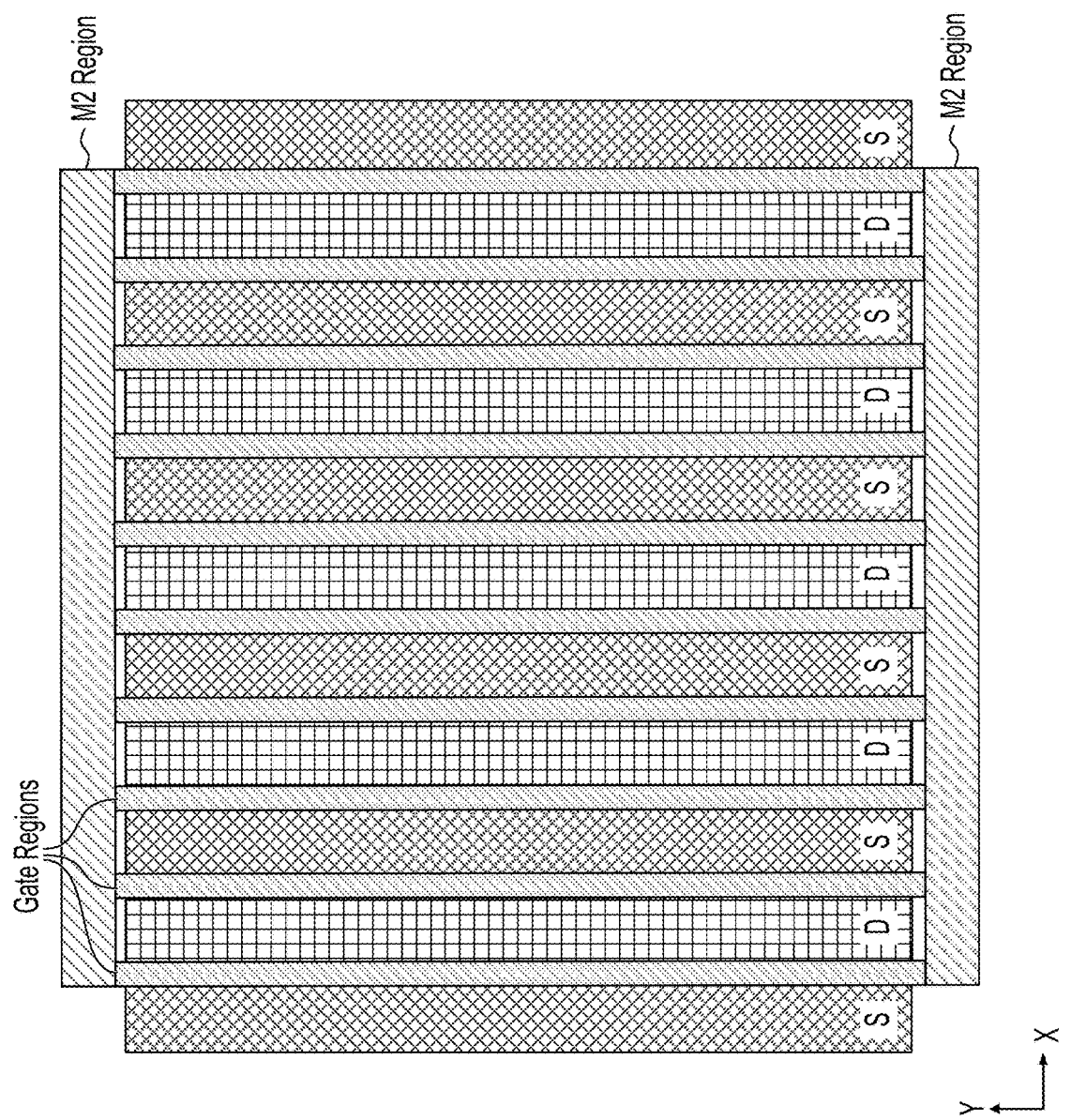
FIG. 11 is a top view of two M2 regions, a plurality of gate regions, and a partial active region of the exemplary integrated circuit for power conversion, in accordance with some embodiments.

FIG. 11 is a top view of two M2 regions, a plurality of gate regions, and a partial active region of integrated circuit 110 for power conversion, in accordance with some embodiments. As shown in FIG. 11, integrated circuit 110 may include the plurality of gate regions formed above the partial active region. The gate regions may extend along the Y-axis direction. Two M2 regions may extend along the X-axis direction. As shown in FIG. 11, two ends of the gate regions may be respectively coupled to the two M2 regions. Both two M2 regions may be configured to transmit currents to or from the gate regions. Thus, current transmissions may be fast and efficient. The two M2 regions in FIG. 11 may be the upper and lower two of the eight M2 regions above an active region in FIG. 9B. The other six of the eight M2 regions above the active region may be coupled to source regions or drain regions of the power transistors.

In some embodiments, integrated circuit 110 may include a plurality of power transistors for power conversion. One or more of the power transistors each may include a plurality of active regions, a plurality of terminals, and a plurality of conductive paths. Each terminal may be electrically coupled to at least one of the active regions via at least one of the conductive paths. Each conductive path may comprise one or more laterally oriented metal conductors and one or more vertically oriented metal conductors. In a majority of the conductive paths, a sum of lengths of the one or more vertically oriented metal conductors may exceed a sum of lengths of the one or more laterally oriented metal conductors.

For example, a power transistor of integrated circuit 110 may include six active regions (FIG. 9B). Each of the six active regions may include a plurality of transistors, including gate regions, source regions, and drain regions (FIG. 11). All of the gate regions may be coupled together by M2 regions, as shown in FIG. 11. All of the source regions may be coupled together. All of the drain regions may also be coupled together. That is, the plurality of transistors in an active region may be connected in parallel to form an equivalent transistor having multiplied power handling capacity. The equivalent transistors of the six active regions may be further connected in parallel to form the power transistor having a high power handling capacity.

The power transistor may also include a plurality of terminals coupled to M4 regions (FIG. 7B). The power transistor may also include a plurality of conductive paths, such as conductive path P23-M2 (FIG. 5A). Each terminal may be electrically coupled to at least one of the six active regions via at least one of the conductive paths. Each conductive path may comprise one or more laterally oriented metal conductors (e.g., conductive path P23-M2 on M2 region 202 in FIG. 5A) and one or more vertically oriented metal conductors (e.g., V1, M1, V21, V32, M3, V43, M4 regions along conductive path P23-M2 in FIG. 5A). In a majority of the conductive paths, a sum of lengths of the one or more vertically oriented metal conductors may exceed a sum of lengths of the one or more laterally oriented metal conductors.

In some embodiments, the laterally oriented metal conductors may include first metal conductors in a first metal layer above the active regions and second metal conductors in a second metal layer above the first metal layer. A width of the first metal conductors may be less than a width of the second metal conductors. For example, the laterally oriented metal conductors of the power transistor may include M2 regions 201, 202, and 203 (FIG. 5A) in the M2 layer above the active region. The laterally oriented metal conductors of the power transistor may also include M4 regions 401, 402, and 403 in the M4 layer above the M2 layer. The width of M2 regions 201, 202, and 203 may be 8 µm. The width of M4 regions 401, 402, and 403 may be 35 µm. The width (8 µm) of M2 regions 201, 202, and 203 is less than the width (35 µm) of M4 regions 401, 402, and 403.

In some embodiments, in the power transistor, a current flowing in each laterally oriented metal conductor in the second metal layer exceeds a current flowing in each laterally oriented metal conductor in the first metal layer. For example, a current flowing in each laterally oriented M4 region in the M4 layer may be 0.3 mA. A current flowing in each laterally oriented M2 region in the M2 layer may be 0.1 mA. The current (0.3 mA) flowing in each M4 region exceeds the current (0.1 mA) flowing in each M2 region.

In some embodiments, in the power transistor, a resistance of each laterally oriented metal conductor in the second metal layer is less than a resistance of each laterally oriented metal conductor in the first metal layer. For example, M4 regions 401, 402, and 403 (FIG. 5A) in the M4 layer are thicker than M2 regions 201, 202, and 203 (FIG. 5A) in the M4 layer. Thus, a resistance of each of M4 regions 401, 402, and 403 is less than a resistance of each of M2 regions 201, 202, and 203.

Figure 12:
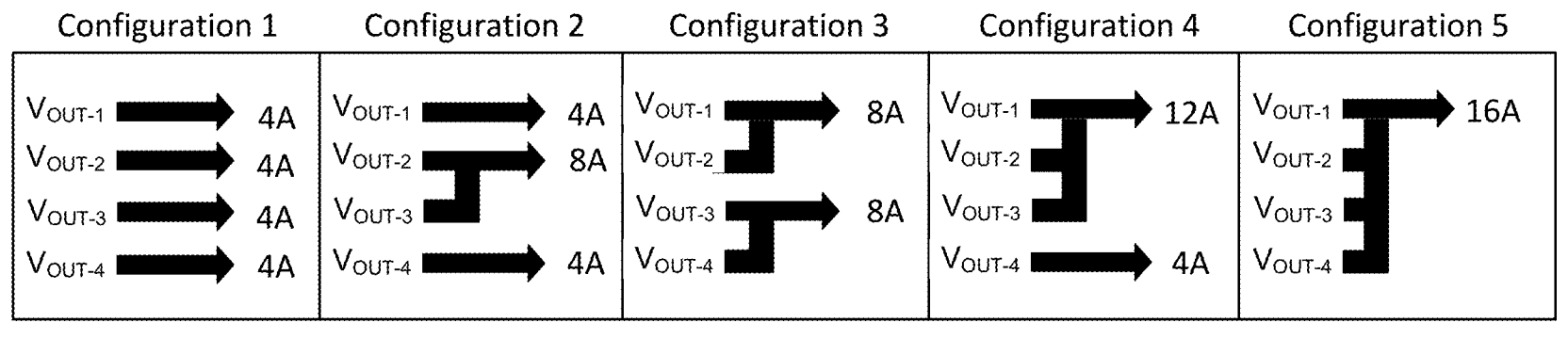

FIG. 12 illustrates exemplary configurations of apparatus 100 for power conversion in FIG. 1, in accordance with disclosed embodiments. As shown in FIG. 12, apparatus 100 may have configurations 1, 2, 3, 4, and 5 for outputting power. Controller 114 (FIG. 4) may be configured to determine one of configurations 1, 2, 3, 4, and 5, and to couple inductors 131, 132, 133, and 134 based on the determined configuration. As shown in FIG. 2D, inductors 131, 132, 133, and 134 may share inductor core 135 and may be coupled together based on the determined configuration.

In configuration 1, controller 114 may be configured to determine that inductors 131, 132, 133, and 134 output a current of 4 ampere (A) from output power $V_{OUT\text{-}1}$, $V_{OUT\text{-}2}$, $V_{OUT\text{-}3}$, and $V_{OUT\text{-}4}$, respectively. In configuration 2, controller 114 may be configured to determine that inductors 132 and 133 may be coupled together to output a current of 8 A based on output power $V_{OUT\text{-}2}$ and $V_{OUT\text{-}3}$. Controller 114 may be also configured to determine that inductors 131 and 134 output a current of 4 A from output power $V_{OUT\text{-}1}$ and $V_{OUT\text{-}4}$, respectively. In configuration 3, controller 114 may be configured to determine that inductors 131 and 132 may be coupled together to output a current of 8 A based on output power $V_{OUT\text{-}1}$ and $V_{OUT\text{-}2}$. Controller 114 may be also configured to determine that inductors 133 and 134 may be coupled together to output a current of 8 A based on output power $V_{OUT\text{-}3}$ and $V_{OUT\text{-}4}$.

In configuration 4, controller 114 may be configured to determine that inductors 131, 132, and 133 may be coupled together to output a current of 12 A based on output power $V_{OUT\text{-}1}$, $V_{OUT\text{-}2}$, and $V_{OUT\text{-}3}$. Controller 114 may be also configured to determine that inductor 134 outputs a current of 4 A from output power $V_{OUT\text{-}4}$. In configuration 5, controller 114 may be configured to determine that inductors 131, 132, 133, and 134 may be coupled together to output a current of 16A based on output power $V_{OUT\text{-}1}$, $V_{OUT\text{-}2}$, $V_{OUT\text{-}3}$, and $V_{OUT\text{-}4}$.

When controller 114 determine one of configurations 1, 2, 3, 4, and 5, inductors 131, 132, 133, and 134 may be coupled as described above and configured to fan out a plurality of voltage outputs, such as a converted voltage with a current of 4 A, 8A, 12A, and 16A, as illustrated with reference to FIG. 12.

FIG. 13 is a circuit diagram of exemplary apparatus 100 for power conversion in FIG. 1, in accordance with some embodiments. As shown in FIG. 13, apparatus 100 may include integrated circuit 110, inductors 131, 132, 133, and 134, and a plurality of peripheral circuits, such as capacitors and resistors, coupled to or between integrated circuit 110 and inductors 131, 132, 133, and 134. The peripheral circuits may be implemented on circuit board 120 (FIG. 1). Apparatus 100 may be configured to convert input power $V_{IN}$ based on configurations 1, 2, 3, 4, and 5 (FIG. 12).

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the disclosure disclosed herein. It is also intended that the sequence of steps shown in figures are only for illustrative purposes and are not intended to be limited to any particular sequence of steps. As such, those skilled in the art can appreciate that these steps can be performed in a different order while implementing the same method.

It is appreciated that certain features of the specification, which are, for clarity, described in the context of separate embodiments, may also be provided in combination in a single embodiment. Conversely, various features of the specification, which are, for brevity, described in the context of a single embodiment, may also be provided separately or in any suitable sub-combination or as suitable in any other described embodiments of the specification. Certain features described in the context of various embodiments are not to be considered essential features of those embodiments unless the embodiment is inoperative without those elements.

The embodiments may further be described using the following clauses:

1. An apparatus for power conversion, comprising:
   an integrated circuit for power conversion, comprising:
   a plurality of power transistors; and
   a plurality of metal regions coupled to the plurality of power transistors, wherein:
   a first portion of the metal regions are coupled to source regions of the plurality of power transistors;
   a second portion of the metal regions are coupled to drain regions of the plurality of power transistors; and
   the first and second portions have at least one of substantially equal numbers of metal regions, substantially equal resistances, or balanced distributions of metal regions.

2. The apparatus of clause 1, the integrated circuit to be mounted on a circuit board comprising a surface and a plurality of conductive lines, the conductive lines extending along a direction perpendicular to the surface, the integrated circuit to be coupled to the conductive lines.

3. The apparatus of clause 2, the integrated circuit to be coupled to an inductor mounted on the surface of the circuit board through at least one of the conductive lines, at least a portion of the integrated circuit to be beneath the inductor.

4. The apparatus of clauses 1-3, wherein the plurality of metal regions comprise:
   a plurality of first metal regions in a first layer, the first metal regions having a first width; and
   a plurality of second metal regions in a second layer, the second metal regions having a second width, the second layer being above the first layer, wherein the second width is greater than the first width.

5. The apparatus of clause 4, wherein the second width is twice the first width.

6. The apparatus of clause 4, wherein the plurality of metal regions further comprise:
a plurality of third metal regions in a third layer, the third metal regions having a third width, the third layer being above the second layer,
wherein the third width is greater than the second width.

7. The apparatus of clause 6, wherein the third width is twice the second width.

8. The apparatus of clause 6, wherein the plurality of metal regions further comprise:
a plurality of fourth metal regions in a fourth layer, the fourth layer being below the first layer and having a fourth width, wherein:
a first portion of the fourth metal regions are coupled to the source regions of the plurality of power transistors;
a second portion of the fourth metal regions are coupled to the drain regions of the plurality of power transistors; and
the fourth width is significantly less than the first width.

9. The apparatus of clauses 1-8, wherein the direction is a first direction, wherein the plurality of metal regions comprise:
a plurality of first metal regions extending along a second direction in a first layer; and
a plurality of second metal regions extending along a third direction in a second layer, the second layer being above the first layer,
wherein the third direction is perpendicular to the second direction.

10. The apparatus of clause 9, wherein the plurality of metal regions further comprise:
a plurality of third metal regions extending along the second direction in a third layer, the third layer being above the second layer.

11. The apparatus of clause 10, wherein the plurality of power transistors comprise:
a plurality of gate regions extending along the third direction,
wherein two ends of the gate regions of the plurality of power transistors are coupled to a portion of the first metal regions.

12. The apparatus of clause 11, wherein the integrated circuit further comprises:
a plurality of fourth metal regions extending along the third direction in a fourth layer, the fourth layer being above the third layer,
wherein the fourth metal regions extend along the same third direction as the gate regions.

13. The apparatus of clause 11, wherein the integrated circuit further comprises:
a plurality of first vias coupled between the first metal regions and the second metal regions; and
a plurality of second vias coupled between the second metal regions and the third metal regions, wherein:
the first vias have balanced distribution over the plurality of power transistors; and
the second vias have balanced distribution over the plurality of power transistors.

14. The apparatus of clause 3, wherein the inductor is connected to buck converter circuitry within the integrated circuit through the conductive lines.

15. The apparatus of clause 3, wherein the inductor is connected to the integrated circuit through a plurality of the conductive lines.

16. The apparatus of clause 3, wherein the inductor is a coupled inductor.

17. The apparatus of clause 3, wherein the inductor is a chip inductor.

18. The apparatus of clause 3, wherein:
the integrated circuit includes charge-pump circuitry and buck converter circuitry; and
the buck converter circuitry is connected to the inductor through at least one of the conductive lines.

19. The apparatus of clause 3, wherein:
the integrated circuit includes charge-pump circuitry for two or more charge-pumps and buck converter circuitry for at least two buck converters;
the inductor includes at least two chip inductors; and
the at least two buck converters are individually connected to respective ones of the at least two chip inductors through respective ones of the conductive lines.

20. The apparatus of clause 2, wherein:
the conductive lines are located on a common edge of the circuit board.

21. The apparatus of clause 2, wherein:
the integrated circuit comprises a plurality of output terminals to output currents;
the output terminals are directly coupled to the conductive lines; and
the conductive lines extend directly from the output terminals, along the direction perpendicular to the surface, and to the inductor.

22. The apparatus of clause 21, wherein the output terminals are within the portion of the integrated circuit beneath the inductor.

23. The apparatus of clause 2, wherein the integrated circuit is to be embedded inside the circuit board.

24. The apparatus of clause 23, wherein:
the circuit board comprises first, second, and third layers;
the second layer is between the first and third layers; and
the integrated circuit mounted in the second layer.

25. The apparatus of clause 23, wherein:
the circuit board comprises first and second metal layers;
the conductive lines are coupled between the first and second metal layers; and
the integrated circuit is coupled to the conductive lines in the second metal layer.

26. The apparatus of clause 2, wherein:
the surface is a first surface;
the circuit board further comprises a second surface; and
the integrated circuit is mounted on the second surface.

27. The apparatus of clause 3, wherein the inductor comprises a plurality of coupled inductors, the coupled inductors sharing an inductor core.

28. The apparatus of clause 27, wherein:
the integrated circuit includes a control circuit;
the control circuit determines an output configuration of the coupled inductors; and
the coupled inductors fan out a plurality of voltage outputs.

29. The apparatus of clause 27, wherein:
the integrated circuit includes a control circuit;
the control circuit is to output vertical currents from the integrated circuit to the inductor, the vertical currents flowing along a direction perpendicular to the integrated circuit.

30. A power transistor for power conversion, comprising:
a plurality of active regions;
a plurality of terminals; and
a plurality of conductive paths;

wherein:
each terminal is electrically coupled to at least one of the active regions via at least one of the conductive paths;
each conductive path comprises one or more laterally oriented metal conductors and one or more vertically oriented metal conductors; and
in a majority of the conductive paths, a sum of lengths of the one or more vertically oriented metal conductors exceeds a sum of lengths of the one or more laterally oriented metal conductors.

31. The power transistor of clause 30, wherein the laterally oriented metal conductors comprise:
first metal conductors in a first metal layer above the active regions; and
second metal conductors in a second metal layer above the first metal layer,
wherein a width of the first metal conductors is less than a width of the second metal conductors.

32. The power transistor of clause 31, wherein a current flowing in each laterally oriented metal conductor in the second metal layer exceeds a current flowing in each laterally oriented metal conductor in the first metal layer.

33. The power transistor of clause 31, wherein a resistance of each laterally oriented metal conductor in the second metal layer is less than a resistance of each laterally oriented metal conductor in the first metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for power conversion, comprising:
an integrated circuit for power conversion, comprising:
a plurality of power transistors in an active region of a substrate, wherein each transistor includes a gate extending across the active region in a first direction; and
a plurality of metal layers adjacent the substrate and including a first metal layer that is closest to the substrate and a second metal layer that is adjacent the first metal layer, wherein each metal layer is configured to form a plurality of metal regions coupled to the plurality of power transistors, and wherein:
a first portion of the metal regions of each metal layer are coupled to source regions of the plurality of power transistors;
a second portion of the metal regions of each metal layer are coupled to drain regions of the plurality of power transistors;
the metal regions of the first metal layer extend in the first direction across the active region;
the metal regions of the second metal layer extend in a second direction that is orthogonal to the first direction across the active region; and
a width of each metal region of the second metal layer is greater than a width of each metal region of the first metal layer.

2. The apparatus of claim 1, wherein the integrated circuit is mounted on a circuit board comprising a surface and a plurality of conductive lines, the conductive lines extending along a direction perpendicular to the first direction and to the second direction, the integrated circuit to be coupled to the conductive lines.

3. The apparatus of claim 2, wherein the integrated circuit is coupled to an inductor mounted on the surface of the circuit board through at least one of the conductive lines, at least a portion of the integrated circuit to be is beneath the inductor.

4. The apparatus of claim 1, wherein:
the plurality of metal layers further comprises a third metal layer and a fourth metal layer,
the third metal layer is positioned between the second metal layer and the fourth metal layer,
the metal regions of the third metal layer extend in the first direction across the active region,
the metal regions of the fourth metal layer extend in the second direction across the active region,
a width of each metal region of the third metal layer is greater than the width of each metal region of the second metal layer, and
a width of each metal region of the fourth metal layer is greater than the width of each metal region of the third metal layer.

5. The apparatus of claim 1, wherein the width of each metal region in the second metal layer is twice the width of each metal region in the first metal layer.

6. The apparatus of claim 4, wherein the width of each metal region of the third metal layer is twice the width of each metal region of the second metal layer.

7. The apparatus of claim 6, wherein the width of each metal region of the fourth metal layer is twice the width of each metal region of the third metal layer.

8. The apparatus of claim 1, wherein a resistance of the first portion of the metal regions is substantially equal to a resistance of the second portion of the metal regions.

9. The apparatus of claim 1, wherein a number of the metal regions in the first portion is substantially equal to a number of the metal regions in the second portion.

10. The apparatus of claim 1,
wherein two ends of the gates of the plurality of power transistors are coupled to a portion of the metal regions of the first metal layer.

11. The apparatus of claim 4, wherein the integrated circuit further comprises:
a plurality of first vias coupled between the metal regions of the first metal layer and the metal regions of the second metal layer; and
a plurality of second vias coupled between the metal regions of the second metal layer and the metal regions of the third metal layer, wherein:
the first vias have a balanced distribution over the plurality of power transistors; and
the second vias have a balanced distribution over the plurality of power transistors.

12. The apparatus of claim 2, wherein:
the conductive lines are located on a common edge of the circuit board.

13. The apparatus of claim 2, wherein the integrated circuit is embedded inside the circuit board.

14. The apparatus of claim 13, wherein:
the circuit board comprises first, second, and third layers;
the second layer is between the first and third layers; and
the integrated circuit mounted in the second layer.

15. The apparatus of claim 13, wherein:
the circuit board comprises first and second circuit board metal layers;
the conductive lines are coupled between the first and second circuit board metal layers; and
the integrated circuit is coupled to the conductive lines in the second circuit board metal layer.

16. The apparatus of claim 2, wherein:
the surface is a first surface;
the circuit board further comprises a second surface; and
the integrated circuit is mounted on the second surface.

17. The apparatus of claim 3, wherein the inductor is connected to buck converter circuitry within the integrated circuit through the conductive lines.

18. The apparatus of claim 3, wherein the inductor is connected to the integrated circuit through a plurality of the conductive lines.

19. The apparatus of claim 3, wherein the inductor is a coupled inductor.

20. The apparatus of claim 3, wherein the inductor is a chip inductor.

21. The apparatus of claim 3, wherein:
the integrated circuit includes charge-pump circuitry and buck converter circuitry; and
the buck converter circuitry is connected to the inductor through at least one of the conductive lines.

22. The apparatus of claim 3, wherein:
the integrated circuit includes charge-pump circuitry for two or more charge-pumps and buck converter circuitry for at least two buck converters;
the inductor includes at least two chip inductors; and
the at least two buck converters are individually connected to respective ones of the at least two chip inductors through respective ones of the conductive lines.

23. The apparatus of claim 3, wherein:
the integrated circuit comprises a plurality of output terminals to output currents;
the output terminals are directly coupled to the conductive lines; and
the conductive lines extend directly from the output terminals, along the direction perpendicular to the surface, and to the inductor.

24. The apparatus of claim 23, wherein the output terminals are within the portion of the integrated circuit beneath the inductor.

25. The apparatus of claim 3, wherein the inductor comprises a plurality of coupled inductors, the coupled inductors sharing an inductor core.

26. The apparatus of claim 25, wherein:
the integrated circuit includes a control circuit;
the control circuit determines an output configuration of the coupled inductors; and
the coupled inductors fan out a plurality of voltage outputs.

27. The apparatus of claim 25, wherein:
the integrated circuit includes a control circuit; and
the control circuit is configured to output vertical currents from the integrated circuit to the inductor, the vertical currents flowing along the direction perpendicular to the surface of the integrated circuit.

28. A power transistor for power conversion, comprising:
a plurality of active regions in a substrate;
a plurality of metal layers adjacent to the substrate and including a first metal layer that is closest to the substrate and a second metal layer that is adjacent the first metal layer, the plurality of metal layers being configured into a plurality of laterally oriented metal conductors;
a plurality of terminals; and
a plurality of vertically oriented metal conductors;
wherein:
the laterally oriented metal conductors of the first metal layer extend in a first direction;
the laterally oriented metal conductors of the second metal layer extend in a second direction that is orthogonal to the first direction;
the plurality of laterally oriented metal conductors are coupled to the plurality of vertically oriented metal conductors to form a plurality of conductive paths;
each terminal is electrically coupled to at least one of the active regions via at least one of the conductive paths;
each conductive path comprises one or more laterally oriented metal conductors and one or more vertically oriented metal conductors; and
in a majority of the conductive paths, a sum of lengths of the one or more vertically oriented metal conductors exceeds a sum of lengths of the one or more laterally oriented metal conductors.

29. The power transistor of claim 28, wherein the laterally oriented metal conductors comprise:
wherein a width of the laterally oriented metal conductors of the first metal layer is less than a width of the laterally oriented metal conductors of the second metal layer.

30. The power transistor of claim 29, wherein a current flowing in each laterally oriented metal conductor in the second metal layer exceeds a current flowing in each laterally oriented metal conductor in the first metal layer.

31. The power transistor of claim 29, wherein a resistance of each laterally oriented metal conductor in the second metal layer is less than a resistance of each laterally oriented metal conductor in the first metal layer.

* * * * *